United States Patent [19]
Minakuchi et al.

[11] Patent Number: 5,892,219
[45] Date of Patent: Apr. 6, 1999

[54] LIGHT INTENSITY CONTROLLING DEVICE

[75] Inventors: Tadashi Minakuchi; Masahiro Oono; Mitsunori Iima; Hiroshi Kanazawa, all of Tokyo, Japan

[73] Assignee: Asahi Kogaku Kogyo Kabushiki Kaisha, Tokyo, Japan

[21] Appl. No.: 654,824

[22] Filed: May 29, 1996

[51] Int. Cl.$^6$ ....................................................... H01S 3/10
[52] U.S. Cl. .......................... 250/205; 250/225; 250/234; 372/31; 372/38; 347/133
[58] Field of Search ...................................... 250/205, 204, 250/552, 214 R, 214 C, 214 AG, 224, 225, 216, 234, 235, 236; 356/364, 369; 358/474, 475; 359/204; 372/26, 27, 29, 31, 38; 347/133, 134, 135

[56] References Cited

U.S. PATENT DOCUMENTS

| | | |
|---|---|---|
| 4,581,617 | 4/1986 | Yoshimoto et al. . |
| 4,761,659 | 8/1988 | Negishi . |
| 4,796,265 | 1/1989 | Asada et al. . |
| 4,802,179 | 1/1989 | Negishi . |
| 4,811,348 | 3/1989 | Arimoto et al. . |
| 4,879,459 | 11/1989 | Negishi . |
| 4,942,584 | 7/1990 | Karaki et al. . |
| 4,949,345 | 8/1990 | Luijtjes . |
| 5,021,647 | 6/1991 | Tatsuno et al. ........................... 250/205 |
| 5,166,510 | 11/1992 | Matsubara et al. ...................... 250/205 |
| 5,305,337 | 4/1994 | Araki et al. . |
| 5,369,272 | 11/1994 | Eguchi . |
| 5,377,213 | 12/1994 | Honda . |
| 5,473,153 | 12/1995 | Ataki et al. . |
| 5,600,126 | 2/1997 | Appel et al. ............................. 250/205 |
| 5,659,414 | 8/1997 | Appel et al. ............................. 250/205 |

FOREIGN PATENT DOCUMENTS

| | | |
|---|---|---|
| 0165060 | 12/1985 | European Pat. Off. . |
| 0418819 | 3/1991 | European Pat. Off. . |
| 0464556 | 1/1992 | European Pat. Off. . |
| 0505156 | 9/1992 | European Pat. Off. . |
| 1515606 | 6/1978 | United Kingdom . |
| 2134351 | 8/1984 | United Kingdom . |

*Primary Examiner*—Edward P. Westin
*Assistant Examiner*—John R Lee
*Attorney, Agent, or Firm*—Greenblum & Bernstein, P.L.C.

[57] ABSTRACT

A light intensity controlling device has a beam splitter which splits light fluxes emitted from a plurality of independently controlled semiconductor lasers, guided by optical fibers, into monitor light fluxes and main light fluxes. A gain adjusting circuit corrects the changes of output of light receiving elements depending on the polarization states of the light fluxes incident into the beam splitter. The changes result from the polarization characteristics of the optical fibers and/or the beam splitter. Alternatively, a filter is provided at one of the light receiving elements to compensate for the changes, thus providing a corrected output signal. Laser control circuits control the light emitting intensity of each semiconductor laser based on corrected output signals. The light receiving elements are set at an angle to the incoming light as so to avoid directing reflected light back toward an imaging system or the lasers.

60 Claims, 23 Drawing Sheets

LIGHT INTENSITY CONTROLLING DEVICE

BACKGROUND OF THE INVENTION

The present invention relates to a device and method for the detection and control of the light intensity of a laser light source used in a laser printer or the like.

In a conventional laser printer, output from a laser light source is guided via an optical system to a rotating or oscillating mirror, and is scanned across a photoconductive drum by the mirror. The photoconductive drum is thereby exposed, and an electrostatic latent image (to be transferred to a recording sheet) is formed on the photoconductive drum.

Since the density of the electrostatic latent image changes with the light intensity of the laser flux output from the laser light source, the power of the laser flux must be controlled to a predetermined magnitude. Conventionally, in laser printer systems, the intensity is controlled according to an intensity detector provided as part of the laser light source or at the laser light source.

However, the intensity of the laser flux guided to the photoconductive drum changes as it passes through the optical system between the laser light source and the photoconductive drum, or is changed during transmission due to environmental variations, causing the printing precision of the laser printer to become unstable.

One method of controlling the intensity includes splitting the light flux emitted from light source into a monitor light flux and a main light flux. The light intensity of the main light flux is controlled by detecting the light intensity of the monitor light flux. This kind of light intensity controlling device is widely used in the field of optical disk devices. A light flux emitted from a light source (such as a semiconductor laser) is split by a light splitting element (such as a beam splitter), and one of the split light fluxes is used as a monitor light flux. The other (main) flux is introduced to an optical disk, and is modulated to write information on the disk. This method is known as automatic power control (ARC).

However, in the conventional light intensity controlling device, where more than one light source emit light fluxes having differing states of polarization, the intensity on an image plane can not be kept at an predetermined value by the APC operation. This is also the case in a device using one or more light sources, where the state of polarization of the light flux from the light source(s) is changed due to environmental fluctuations.

In general, the transmissivity or reflection index of an optical splitting element, and the indices of other optical elements guiding the main light flux onto the image plane, have polarization dependency. In other words, depending on the state(s) of polarization of an incident light flux, the light energy (light quantity) of the transmitted light or reflected light varies. In particular, since only an extremely small portion of the light quantity is split to be used as a monitor light flux in comparison to the main light flux (in order to secure the optical utilization efficiency on the main light flux side) the light intensity of the monitor light flux may change significantly according to the state(s) of polarization of incident light. Furthermore, the balance between the light intensity of the main light flux and that of the monitor light flux, when split by an optical splitting element, changes according to the state(s) of polarization of incident light flux.

Therefore, when the balance between split light fluxes is lost, a conventional APC operation based on the light intensity of the monitor light flux fails to keep the light intensity of the main light flux on the image plane at a predetermined level.

This problem is particularly significant in an optical system utilizing optical fibers. In optical transmission, general-use optical fibers do not maintain a plane of polarization (although there is a case where the polarization direction of incident linearly polarized light is orthogonal to that of outgoing linearly polarized light). The change in the plane of polarization are caused by the bending and twisting of the optical fibers (as is necessary for installation).

For example, a situation where the problem of a loss of a plane of polarization is significant is in a multi-beam optical system in which light fluxes emitted from several light sources are introduced by optical fibers corresponding to each light source, and spot light sources are formed for each light source. If the light fluxes from the optical fibers are split by a beam splitter to obtain a monitor light flux, even when the state of polarization of light entering the respective optical fibers from each light source may be uniform, the state of polarization of each light flux emitted from the respective optical fibers (and incident into the beam splitter) differs. Therefore, even though an APC operation may be performed on the basis of the light intensity detected from the monitor light flux, it is difficult to keep the light intensity of the main light flux on an image plane constant.

SUMMARY OF THE INVENTION

It is therefore an object of the present invention to provide an improved control for the power of the output from a laser light source so that the intensity of the laser flux at the image plane is controllable at a predetermined level.

It is a further object of the present invention to provide a light intensity controlling device and method by which the light quantity of the main light flux is controllable at a predetermined level on the basis of the intensity of the monitor light flux, even when the states of polarization of light fluxes vary exiting an optical system such as an optical fiber system, or when the states of polarization vary depending on aging or environmental changes.

In order to meet the objects, according to one aspect of the present invention, a laser power detecting device is provided which includes an optical system in the optical path of a laser flux emitted from a laser light source for guiding and emitting the laser flux, and a deflector for deflecting and scanning the laser flux onto a photoconductive member. A beam splitter is also provided between the optical system and the deflector for splitting a part of the laser flux emitted from the optical system to the deflector as a main flux and for splitting a remaining part of the laser flux as a monitor flux, and the laser power detector further includes a sensor for detecting the intensity of the monitor flux.

Accordingly, since the monitor flux is separated from the original flux after the optical system, aging of the optical system or environmental changes are compensated for, and the sensor accurately matches the intensity of the main flux.

In one particular embodiment of this aspect of the invention, a light receiving surface of the sensor is inclined with respect to a plane perpendicular to the optical axis of the monitor flux guided to the sensor. Any reflected monitor flux is reflected by the light receiving surface and is guided in a direction away from the deflector and away from the laser light source. Accordingly, spurious light is directed away from the image forming surface, including the deflector. Furthermore, reflected light is not directed back along the optical path toward the semiconductor laser or lasers, and the lasers are not subject to feedback instability.

In one preferred structure, a condenser lens is positioned between the beam splitter and the sensor to converge the monitor flux onto the light receiving surface. Accordingly, a smaller light receiving surface can be utilize. Preferably, especially in the case of a multibeam system, the monitor flux emitted from the condenser lens is not focused on the light receiving surface of the sensor.

According to another aspect of the present invention, a light intensity controlling device for controlling at least one light source is provided which includes a light splitting element for splitting a light flux emitted from light source (or sources) into a monitor light flux and main light flux, light detecting device for detecting a monitor light flux intensity, an optical system for introducing the main light flux from the light splitting element onto an image plane. The light intensity controlling device also includes a correcting device for correcting an output of the light detecting device by adjusting the detected monitor light flux intensity, according to intensities of polarization components of the light flux as changed by polarization characteristics of at least the beam splitter, to obtain a constant correlation between the monitor light flux intensity and an intensity of the main flux introduced onto an image plane by the optical system irrespective of polarization states of the light flux entering the light splitting element, and includes a controlling device for controlling a light emitting intensity of the at least one light source in response to the light detecting means as corrected by the correcting device.

Accordingly, discrepancies between the intensity of the monitor flux at the light detecting device and the intensity of the main flux at the image plane, caused by the differences in intensity due to polarization states of light passing the beam splitter and passing the optical system, are corrected. When automatic power control is carried out, the correction of the light detecting device signals ensure a faithful correspondence between the monitor flux detected and the main flux forming beam spots.

In one particular embodiment, the light source includes a plurality of light sources, each of the plurality of light sources being independently controlled to emit light. The light detecting device detects the monitor light flux intensity of each of the plurality of light sources, and the controlling device controls separately the output of each of the plurality of light sources, based on the monitor light flux intensity of each of the plurality light sources, in response to the light detecting device.

In such a case, the polarization dependencies of each of the light sources, as they are passed through the optical system, are compensated, and the light sources each produce an accurate monitor signal, allowing consistency between light sources.

In a refinement of this embodiment, the plurality of light sources are provided with a transmission optical system including a plurality of optical fibers, each corresponding to one of the plurality of light sources, the plurality of optical fibers transmitting light emitted by each of the plurality of light sources to the light splitting element. In this case, the variation in polarization state between the optical fibers is compensated by the correction device.

In another particular embodiment, the light detecting device includes a polarization splitting element for splitting the monitor light flux into first linearly polarized light and second linearly polarized light having electric field vector vibration directions orthogonal to each other, a first light receiving element for receiving the first linearly polarized light, and a second light receiving element for receiving the second linearly polarized light.

In this case, the correcting device is preferably connected to the first light receiving element and to the second light receiving element. The correcting device applies a weighting to an output of the first light receiving element and to an output of the second light receiving element. The weighting gives a predetermined weight to the output of the first light receiving element and output of the second light receiving element based on a relationship, in a light intensity at the image plane, between the first linearly polarized light and the second linearly polarized light.

Accordingly, by splitting and detecting both linear polarized light fluxes of the monitor flux, polarization-dependent intensity variations can be detected, and if the appropriate weighting is given, a correction of the detected monitor flux with respect to the actual main flux amount at the drum can be performed.

In a preferred implementation of this embodiment, the correcting device applies the weighting by generating an output signal S to the controlling device according to an expression: $S=K(Sp+k \cdot Ss)$. In the expression, K is a constant, $k=(Mp/Ms) \cdot (Ps/Pp)$, where Mp, Ms, Ps, and Pp are defined as follows: when the first linearly polarized light enters the light splitting element, the monitor light flux intensity is Mp and the main light flux intensity on the image plane and is Pp; when the second linearly polarized light enters the light splitting element, the monitor light flux intensity is Ms and the main light flux intensity on the image plane is Ps. The output of the first light receiving element is Sp and the output of the second light receiving element is Ss.

In still another aspect of the present invention, a light intensity controlling device for a scanning optical system (having a plurality of semiconductor lasers generating a plurality of light fluxes, a polarizer that polarizes the plurality of light fluxes, and a scanning lens for converging the polarized light fluxes to form a plurality of spots on a scanning target plane) is provided which includes a light splitting element between the semiconductor lasers and polarizer for splitting the plurality of light fluxes into a plurality of corresponding monitor light fluxes and a plurality of corresponding main light fluxes, a light detecting device for detecting the intensity of the plurality of monitor light fluxes, a correcting device for correcting the output of the light detecting device by adjusting the detected monitor light flux intensities according to intensities of polarization components of the light fluxes as changed by polarization characteristics of at least the beam splitter, to obtain a constant correlation between the monitor light flux intensities and intensities of the main flux introduced onto an image plane by the optical system irrespective of polarization states of the light fluxes entering the light splitting element, and controlling device for controlling a light emitting intensity of the plurality of semiconductor lasers in response to the light detecting means as corrected by the correcting device.

In this case, the polarizer is preferably arranged at an angle θ formed between an electric field vibration direction of a first linearly polarized light exiting the polarizer and a transmission axis of the polarizer in a plane perpendicular to the incident direction of the plurality of light fluxes is defined by an expression $\theta=\tan^{-1} \sqrt{k}$. In this case wherein $k=(Mp/Ms) \cdot (Ps/Pp)$, and Mp, Ms, Ps, Pp are as described above.

In yet another aspect of the invention, a light intensity controlling device for controlling a light flux according to a monitor flux split from the light flux, and the light flux is emitted by a laser and passes through an optical system. The light intensity controlling device includes a polarization beam splitter applied to the monitor flux, where the polarization beam splitter splits the monitor flux into a first linearly polarized flux having a first electric field vector vibration direction and a second linearly polarized flux having a second electric field vector vibration direction, and the first electric field vector vibration direction and the second electric field vector vibration direction being orthogonal to each other. Also included is a first intensity sensor applied to the first linearly polarized flux and generating first intensity signals, and a second intensity sensor applied to the second linearly polarized flux and generating second intensity signals and an automatic power control system. The automatic power control system includes a compensation gain adjustment circuit, applied to the second intensity signals, that compensates the second intensity signals with respect to the first intensity signals by a difference between an intensity in the second electric field vector vibration direction and an intensity in the first electric field vector vibration direction of the light flux after passing through the optical system, an adder for adding the first intensity signals and the compensated second intensity signals to produce compensated feedback signals, and a laser control circuit connected to the automatic power control system and the laser, where the laser control circuit controls the emitting intensity of the laser at a predetermined level according to the compensated feedback signals.

In this manner, the automatic power control system takes into account the polarization-dependent changes in intensity of the light flux as it passes through the optical system. As corrected by the automatic power control system, the light flux intensity at the end of the optical system is controlled at the predetermined level regardless of polarization-dependent changes along the way.

The laser may include a plurality of lasers sequentially emitting a plurality of light fluxes. In this arrangement, the automatic power control system includes a timing circuit that times the automatic power control system to individually control the emitting intensity of each of the plurality of lasers according to the first intensity signals and the second intensity signals.

In yet still another aspect of the invention, a scanning optical device is provided which includes at least one semiconductor laser for generating a laser flux, an optical fiber guide for guiding the laser flux from the semiconductor laser, where the optical fiber guide having a first polarization dependency that alters the laser flux, a beam splitter that splits the laser flux from the optical fiber guide into a monitor flux and a main flux having second polarization dependency that alters the monitor flux and the main flux. The scanning optical device also includes a scanning optical system that focuses and scans the main flux from the beam splitter, a photoconductive member that receives the scanned and focused main flux from the scanning optical system, a polarization-compensating light receiving system that receives the monitor flux from the beam splitter and generates polarization-compensated intensity signals based on the alteration in the laser flux at the optical fiber and the alteration in the monitor flux and the main flux at the beam splitter, and an automatic power control control system that receives the polarization-compensated intensity signals and controls the intensity of the laser flux according to the polarization-compensated intensity signals.

The scanning optical system using the polarization-compensated intensity signals is able to compensate for polarization-dependent changes in the intensity of the laser flux along the optical system.

When the scanning optical system has a third polarization dependency that alters the main flux, the polarization-compensating light receiving system generates the polarization-compensated intensity signals based on the alteration in the laser flux at the optical fiber, the alteration in the monitor flux ad the main flux at the beam splitter, and the alteration in the main flux at the scanning optical system.

The semiconductor laser may include a plurality of semiconductor lasers sequentially emitting a plurality of light fluxes. In such an arrangement, the automatic power control system includes a timing circuit that sequences the automatic power control system to individually control the intensity of each of the plurality of laser fluxes according to the polarization-compensated intensity signals In a further aspect of to invention, a light intensity controlling method for controlling a source light flux according to a monitor light flux (the monitor light flux and a main light flux being split by a beam splitter from the source light flux) includes measuring the light intensity of the monitor light flux, and the light intensity of the main light flux introduced at an image plane by an optical system after the beam splitter, for a first linearly polarized light split by the beam splitter; measuring the light intensity of the monitor light flux, and the light intensity of the main light flux introduced at the image plane by the optical system after the beam splitter for a second linearly polarized light, having an electric field vector vibration direction orthogonal to that of the first linearly polarized light, split by the beam splitter; and adjusting a correction for light detection outputcorrecting means for correcting an output of the light detecting means by adjusting the detected monitor light flux intensity, according to intensities of polarization components of the light flux as changed by polarization characteristics of at least the beam splitter, to obtain a constant correlation between the monitor light flux intensity and an intensity of the main flux introduced onto an image plane by the optical system irrespective of polarization states of the light flux entering the light splitting element after the beam splitter. Furthermore, as practical use steps, the method includes correcting light detection output according to the correction; and controlling the source light flux on the basis of the corrected light detection output.

According to a still further aspect of the present invention, a light intensity controlling method for controlling a plurality of independently controlled source light fluxes according to a plurality of monitor light fluxes (the plurality of monitor light fluxes and a plurality of main light fluxes being split by a beam splitter from the plurality of source light flux) includes measuring the light intensity of a representative monitor light flux, and the light intensity of a representative main light flux introduced at an image plane by an optical system after the beam splitter, for a first linearly polarized light split by the beam splitter; measuring the light intensity of the representative monitor light flux, and the light intensity of the representative main light flux at the image plane by the optical system after the beam splitter, for a second linearly polarized light having an electric field vector vibration direction orthogonal to that of the first linearly polarized light, split by the beam splitter; and weighting a first light detection output and a second light detection output by giving a predetermined weight to the first light detection output and the second light detection output based on a relationship, in a light intensity at the image plane, between the first linearly polarized light and the second linearly polarized light. As practical use steps, the method further includes splitting the plurality of monitor light fluxes into first linearly polarized light and second linearly polarized light having electric field vector vibration directions orthogonal to each other correcting the first light detection output and the second light detection output according to the weighting; and controlling the plurality of source light fluxes on the basis of the corrected first light detection output and the corrected second light detection output.

DETAILED DESCRIPTION OF THE PREFERRED EMBODIMENTS

Throughout this specification, a "main scanning direction" is a direction in which a laser flux is swept across the surface of a photoconductive member, and a "auxiliary scanning direction" is a direction in which the photoconductive member is translated or rotated to position the member for a subsequent main scan. The main scanning and auxiliary scanning directions are perpendicular to one another, and are both perpendicular to the optical axes of lenses guiding the laser fluxes. Since a laser flux typically is reflected or "folded" several times in the transmission from the light source to a photoconductive member, the main scanning and auxiliary scanning directions are always referred to with reference to the optical axis at the point in question along the optical path.

Figure 1:
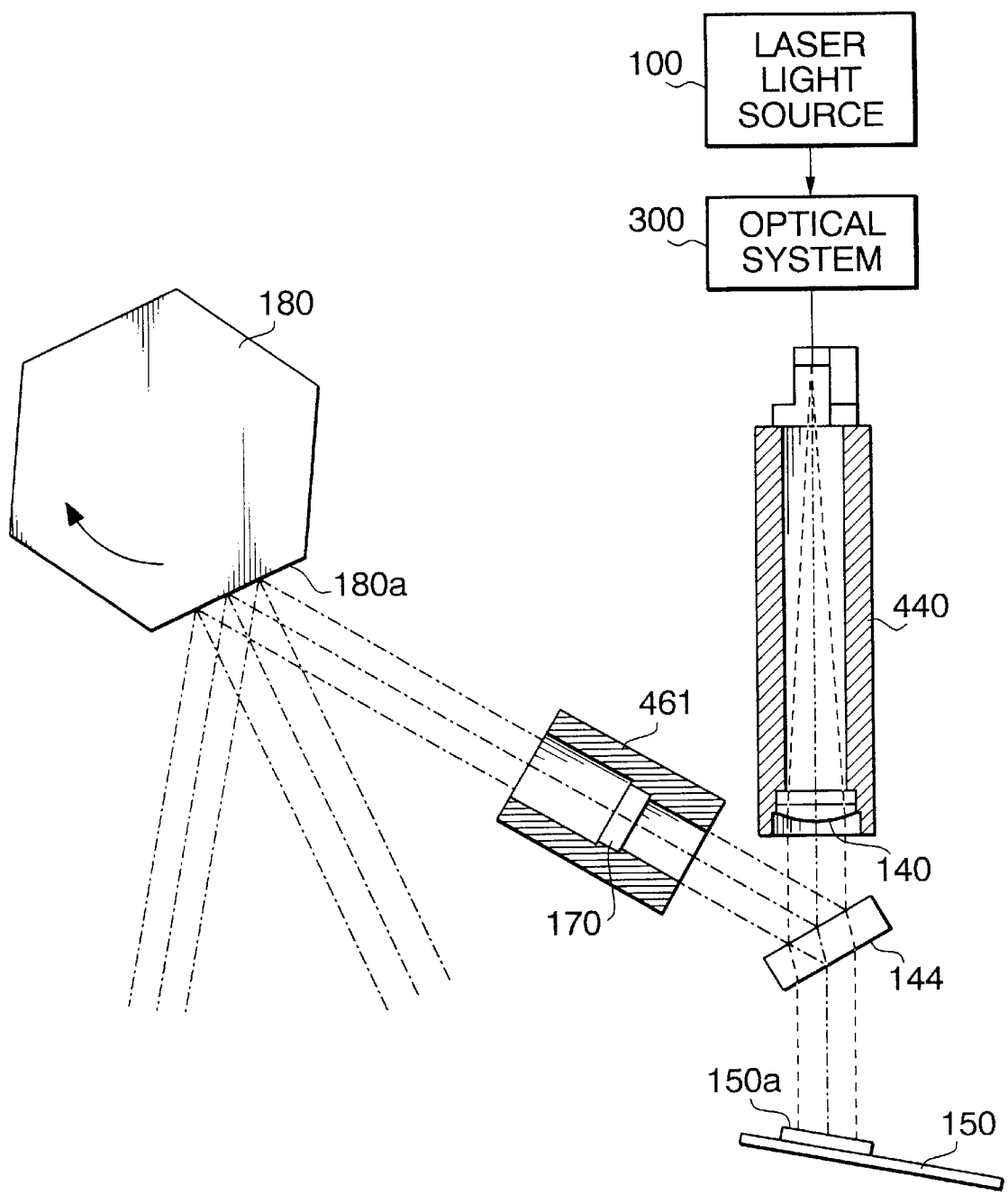
FIG. 1 is a plan view of the first embodiment according to the present invention.

FIG. 1 shows the first embodiment of a light intensity controlling device according to the present invention. The first embodiment is applied to a multi-beam recording device, in other words, to a device in which a plurality of laser fluxes (e.g. eight laser fluxes) expose a photoconductive member per main scan.

A laser light source 100 has eight semiconductor lasers (not shown in FIG. 1). The laser fluxes output from the semiconductor lasers are aligned in a row in a predetermined direction by a transmission optical system 300. The transmission optical system 300 includes, for example, eight optical fibers, each fiber corresponding to one of the semiconductor lasers.

Each of the laser beams emitted from the transmission optical system 300 is collimated by a collimator lens 140 provided inside a lens barrel 440. The laser beams emitted from the collimator lens 140 are all split into a main flux and a monitor flux by a beam splitter mirror 144. The main flux is reflected to a cylindrical lens 170 provided inside a lens barrel 461. The main flux is then converged in the auxiliary-scanning direction by the cylindrical lens 170 and becomes a set of elongated spot images extending in the main scanning direction on the reflecting surfaces of a polygonal mirror 180.

The polygonal mirror (deflector) 180 is rotated at a fixed speed by a motor (not shown in FIG. 1) and the main flux is reflected and main scanned by the reflecting surfaces 180*a* of the polygonal mirror 180 to a photoconductive drum via a scanning lens (not shown in FIG. 1). The photoconductive drum is exposed by the main flux and an electrostatic latent image is thereby formed.

As noted above, the beam splitter mirror 144 transmits a part of the laser flux as a monitor flux. The monitor flux is transmitted to an APC sensor system 150. The intensity of the monitor flux is detected by the APC sensor system 150 and the laser light source 100 is controlled according to the detected intensity. Environmental and aging changes of the transmission optical system 300 and the collimator lens 140 are thereby corrected for, and the intensity of the main flux illuminated on polygonal mirror 180 is controlled at a predetermined level.

The monitor flux detected by the APC sensor system 150 is partially reflected by the light receiving surface. In this embodiment, a light receiving surface 150a of the APC sensor system 150 is tilted away from the polygonal mirror with respect to a plane normal to the laser flux emitted from collimator lens 140. Accordingly, any of the monitor flux reflected by the light receiving surface 150a is guided in a direction away from polygonal mirror 180, preventing reflected monitor flux from being guided to the photoconductive drum where the latent image is formed, and thereby preventing noise. Furthermore, the monitor flux reflected by the APC sensor system 150 is directed away from the collimator lens 140 (i.e., from the optical path leading from the laser light source) and therefore does not affect the laser flux output of the laser light source 100.

Figure 2:
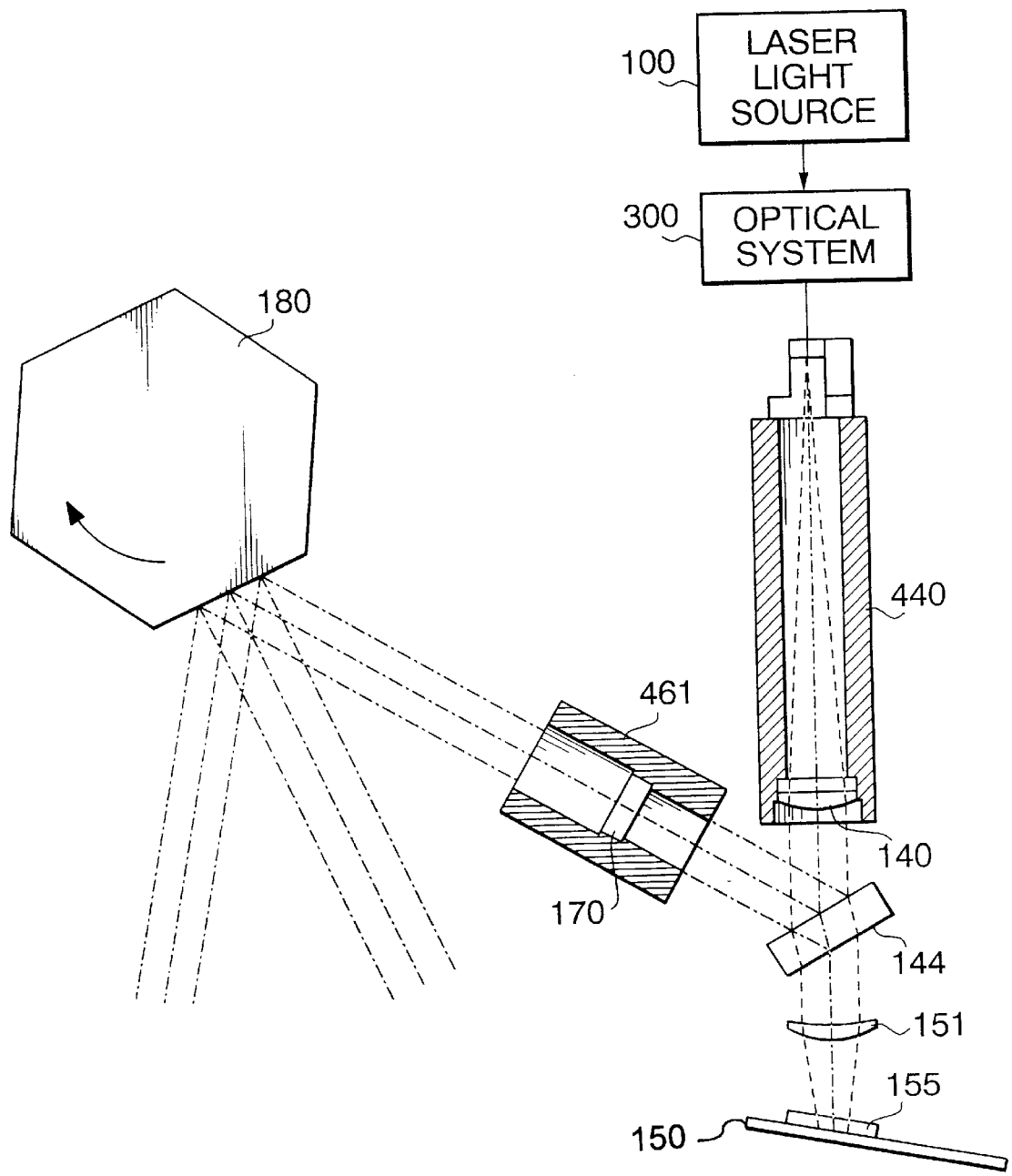
FIG. 2 is a plan view of the second emodiment according to the present invention.

FIG. 2 shows a second embodiment of a light intensity controlling device according to the present invention. In this embodiment, a condenser lens 151, for condensing the monitor flux transmitted through reflecting mirror 144, is positioned between reflecting mirror 144 and APC sensor system 150. The remaining elements of this embodiment are the same as those of the first embodiment.

It is preferable that the light receiving surface 150a of APC sensor system 150 to be as small as possible in order to raise the responsiveness of detection. The condenser lens 151 condenses the monitor flux, and the light receiving surface 150a of the APC sensor system 150 can be smaller.

In the second embodiment, in order that the light receiving surface 155 may receive the monitor flux even in the presence of debris or dirt on the collimator lens 140, the condenser lens 151 is positioned such that the monitor flux of the eight beams is not focused at the light receiving surface 155. That is, it is not so important to form a focused spot on the receiving surface 155, but rather to collect all the light flux. In such a case, an unfocused spot better counteracts dust and dirt in the system.

Figure 15:
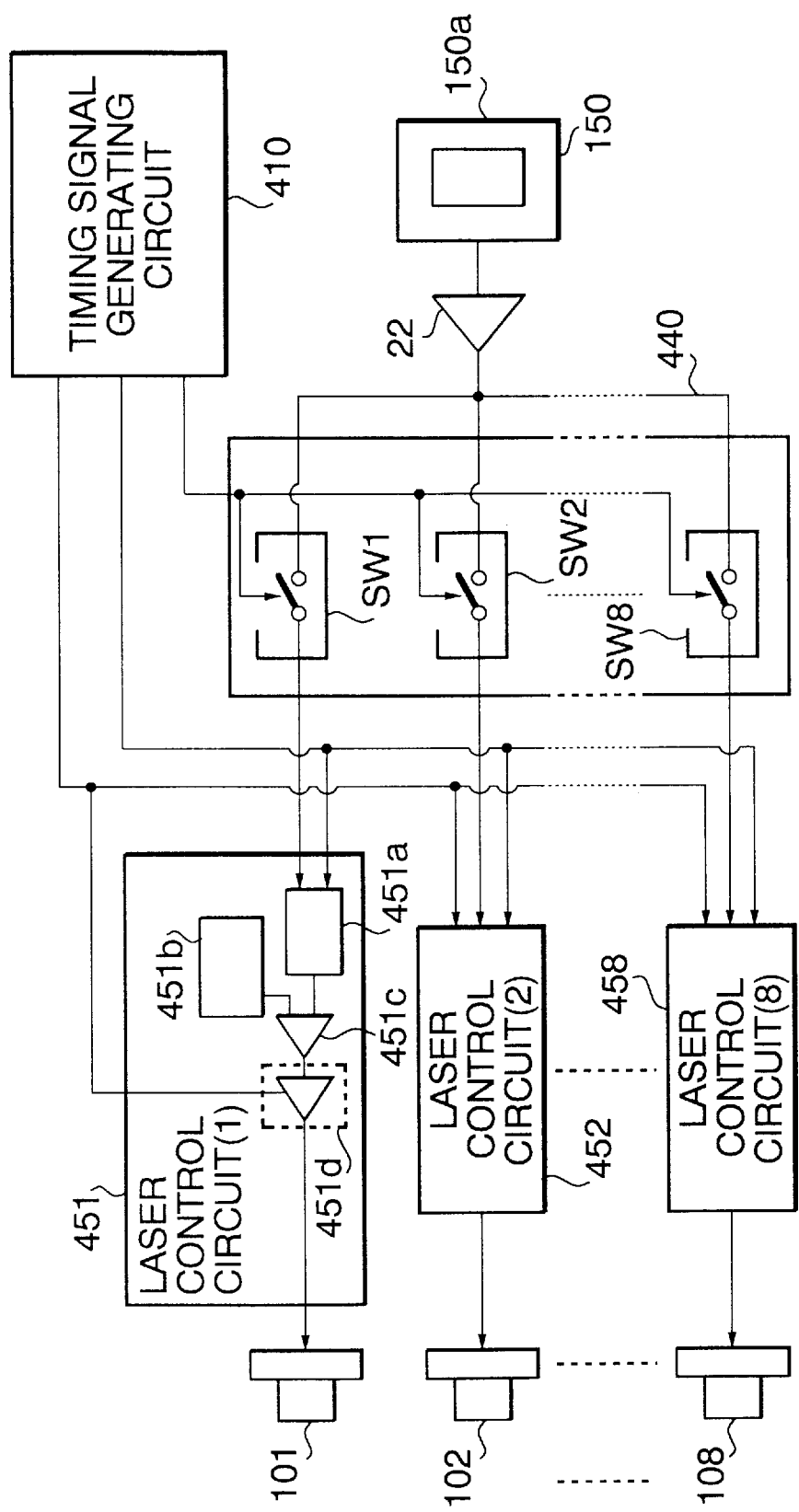
FIG. 15 is a block diagram showing a control system and laser control circuits of the first and second embodiments.

Each of the first and second embodiments is controlled by a laser drive circuit as shown in FIG. 15 and as described later.

A third embodiment of a light intensity controlling device according to the present invention, shown in FIGS. 3 through 27, is applied to a multi-beam scanning optical device producing eight scanning lines at a time using eight source laser fluxes.

Figure 3:
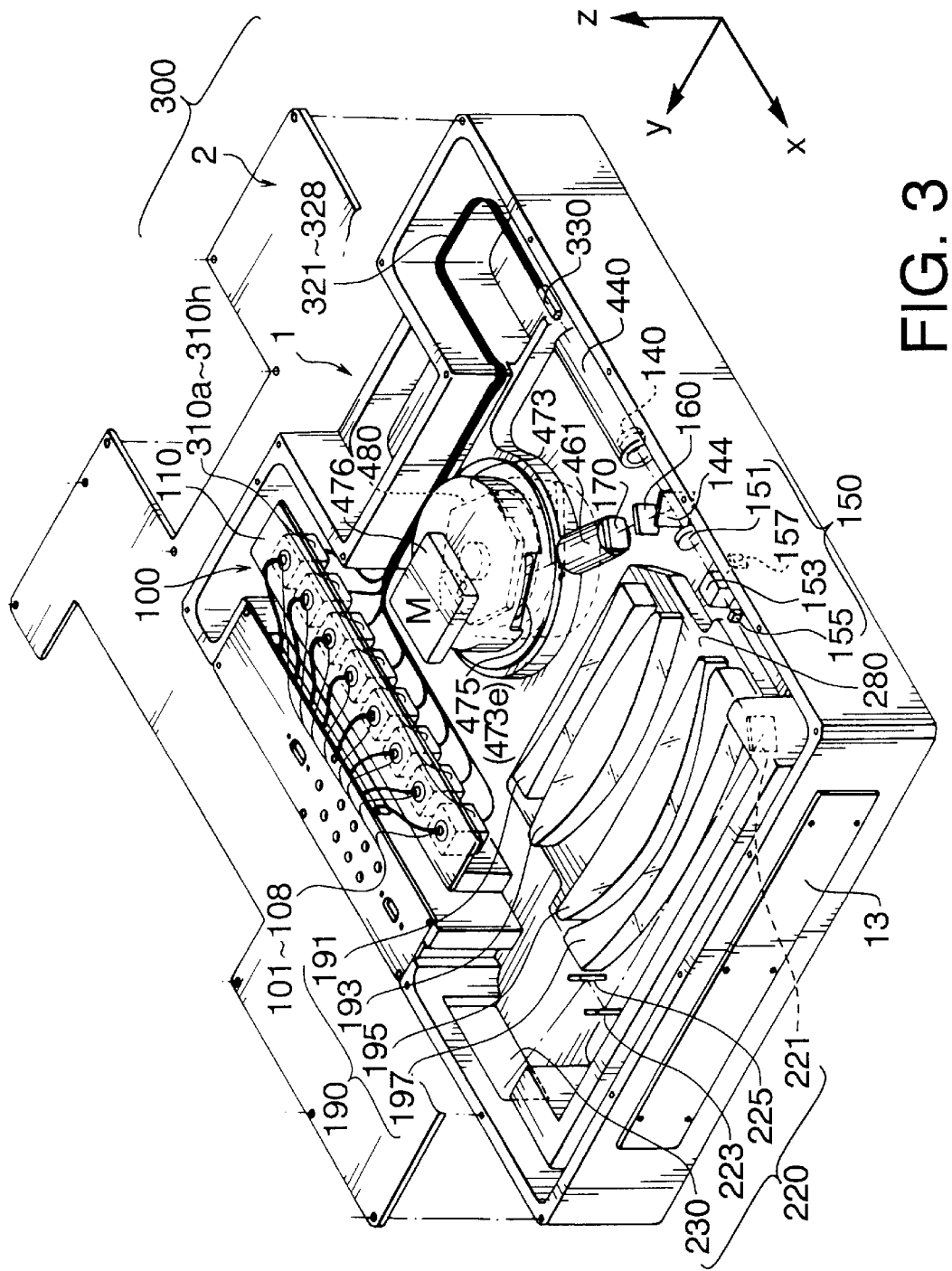
FIG. 3 is a perspective view showing a scanning optical device to which a third embodiment of a light intensity controlling device according to the invention is applied.
Figure 4:
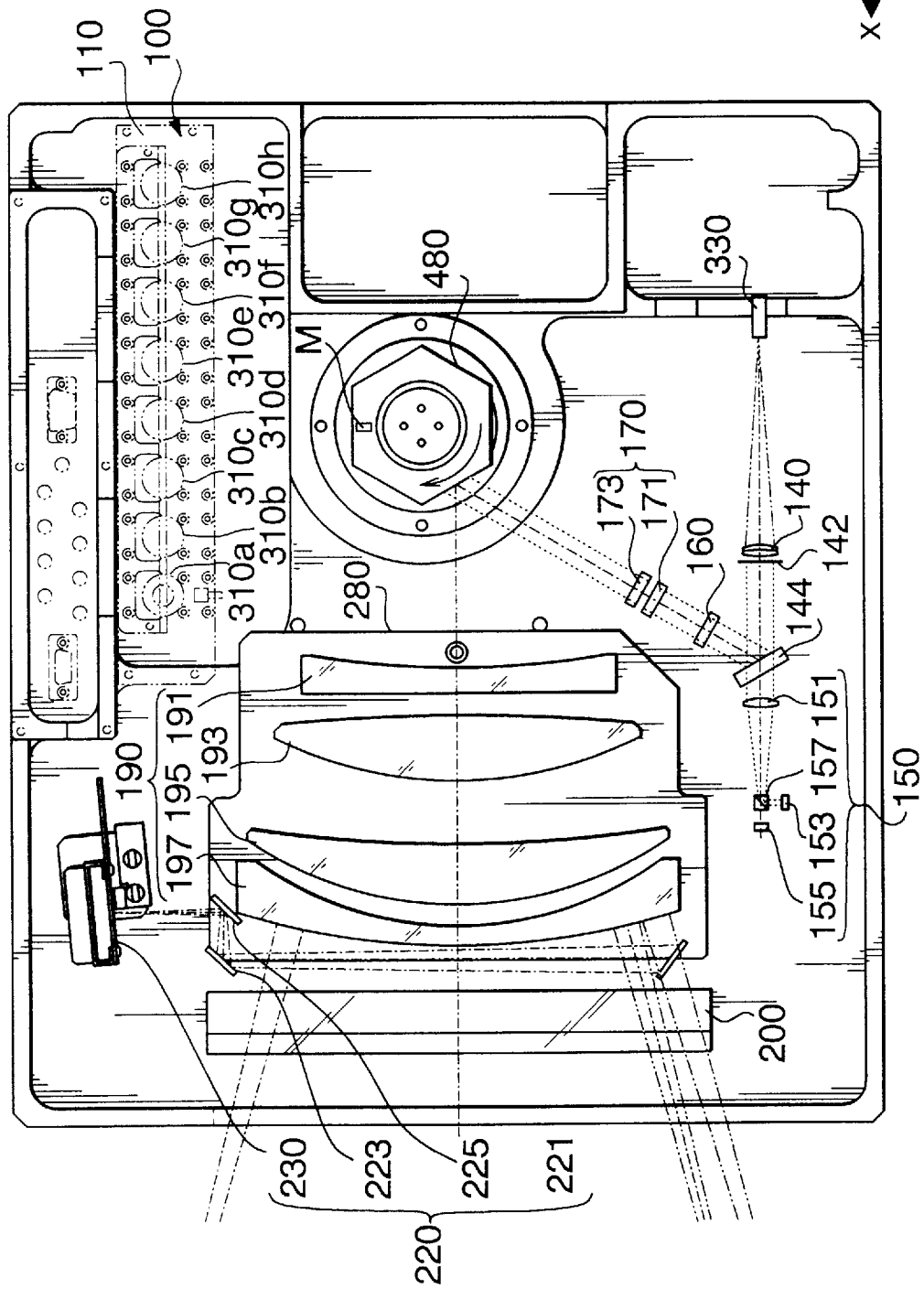
FIG. 4 is a plan view of the device shown in FIG. 3 in the main scanning direction.
Figure 5:
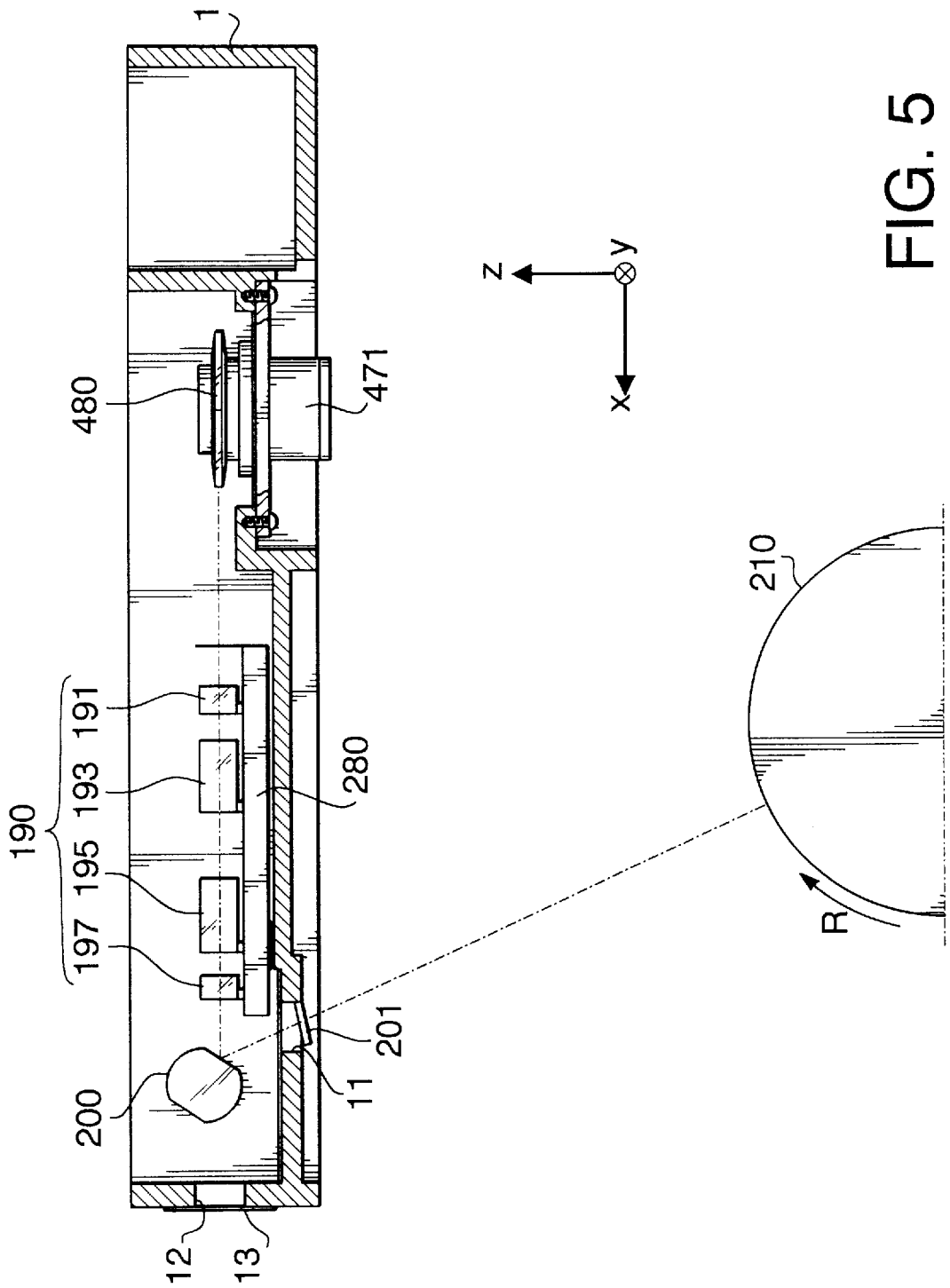
FIG. 5 is a cross-sectional view of the device shown in FIG. 3 in the auxiliary scanning direction.
Figure 6:
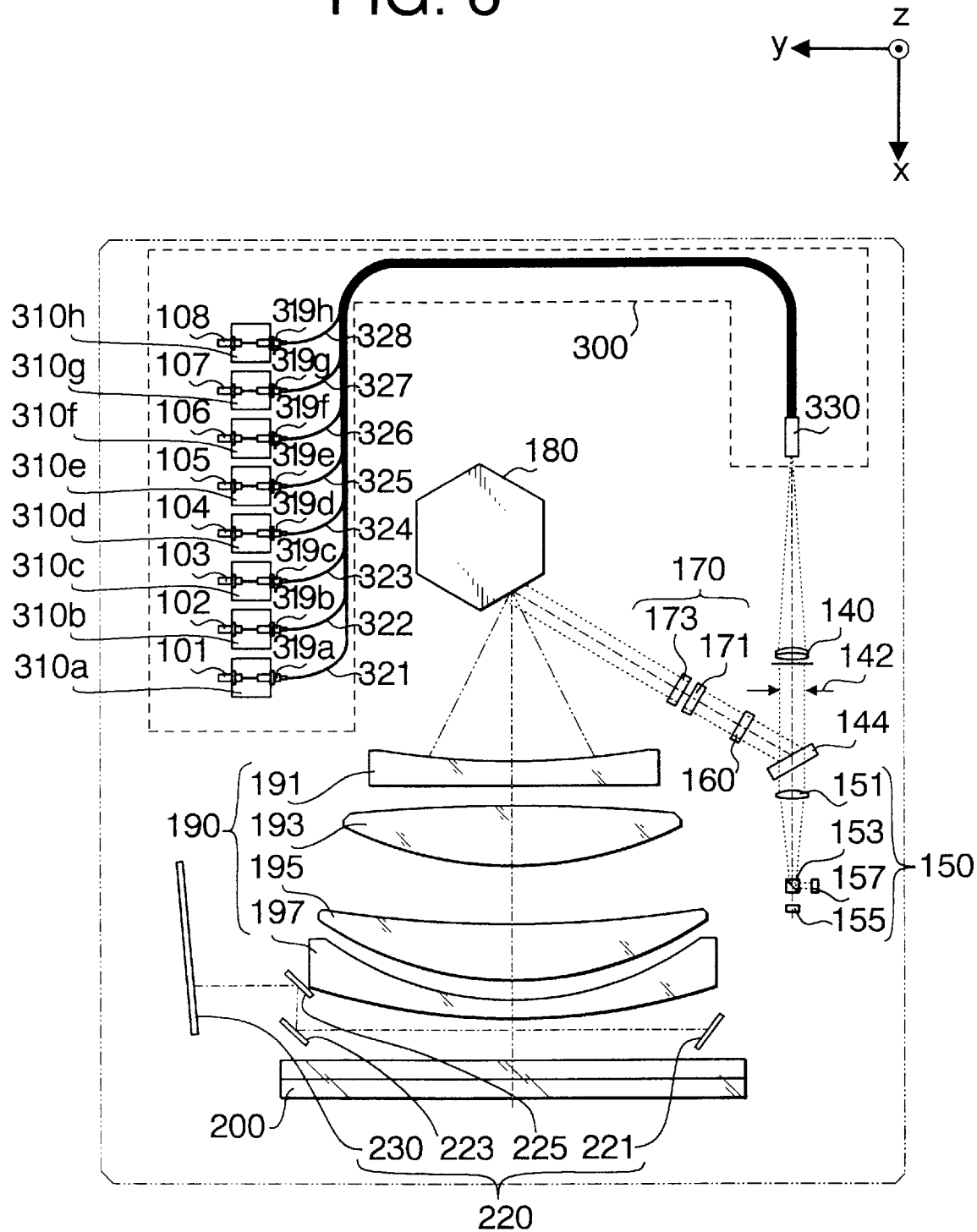
FIG. 6 shows the configuration of the optical system of the device of FIG. 3 in the main scanning direction.

FIG. 3 shows a perspective view of the entirety of a scanning optical device to which the third embodiment is applied, FIG. 4 shows a plan view thereof, FIG. 5 shows a cross-sectional view thereof, and FIG. 6 shows an configuration of the optical system thereof.

As shown in FIG. 3, a scanning optical device has a scanning optical system arranged in a flat rectangular parallelepiped casing 1. In use, the top opening of the casing 1 is closed by an upper cover lid 2.

As shown in FIGS. 3 and 6, a light source portion 100 of the scanning optical-system includes-eight semiconductor lasers 101 through 108. The laser fluxes from each of the lasers 101 through 108 are guided to a beam splitter mirror 144 by a transmission optical system 300. The transmission optical system 300 includes, corresponding to each of the lasers 101 through 108, eight laser blocks 310a through 310h (each attached to a supporting substrate 310) and eight silica glass optical fibers 321 through 328. Each of the lasers 101 through 108 is provided with a coupling lens 111 (shown in FIG. 7) mounted in the corresponding laser block 310a through 310h for guiding the respective laser fluxes to enter the corresponding optical fibers 321 through 328. A fiber alignment block 330 for aligning the eight optical fibers 321 through 328 to form spot images in a straight line retains the exit end portions of the optical fibers 321 through 328. Furthermore, the incident end portions at the incident side of the optical fibers 321 through 328 are retained by fiber supporting members 319a through 319h fixed at the laser blocks 310a through 310h, respectively.

A dispersing light flux emitted from the fiber alignment block 330 is collimated by a collimator lens 140 held by a cylindrical collimator lens barrel 440, and is directed through a slit member 142 to a beam splitter mirror 144. The beam splitter 144 splits the light flux by splitting a part of the incident light flux to be transmitted as a monitor light flux and the remaining part to be reflected as a main light flux. The transmissivity of the beam splitter 144 (i.e., the amount of light transmitted as a monitor flux) is, for example, from 5 to 10 percent as a mean value of S polarized light and P polarized light.

The monitor light flux transmitted by the beam splitter 144 is directed into an automatic power control (APC) sensor system 150. The APC sensor system 150 is a light (or flux) detecting device, and includes a light collecting lens 151 for converging the monitor flux, a polarization beam splitter 153 (a polarization splitting element) which splits the light flux into two polarization components orthogonal to each other, a first light receiving element 155 for APC, and a second light receiving element 157 for APC.

The first and second light receiving elements 155 and 157 detect the light energy of the respective polarization components, and the output of the light receiving elements 155 and 157 is used for a feedback control of the output of the semiconductor lasers 101 through 108.

The main light flux reflected by the beam splitter 144 forms a linear image in the vicinity of the mirror surface of a polygonal mirror 480, by means of a cylindrical lens 170 and a dynamic prism 160. The cylindrical lens 170 has positive power only in the auxiliary scanning direction, and the dynamic prism 160 is rotatably disposed about an axis orthogonal to the optical axis to control the spot position in the auxiliary scanning direction on the image plane. That is, the dynamic prism 160 is preferably a wedge prism, supported to rotated about the main scanning direction in order to deviate the direction of the flux in the auxiliary scanning direction. The dynamic prism 160 corrects the position of image spots (in the auxiliary scanning direction) on the scanning plane resulting from unevenness of rotations of a photoconductive drum 210 (shown in FIG. 5, and described later). As shown in FIG. 6, the cylindrical lens 170 is retained by a cylindrical lens barrel 461 and is composed of two lenses 171, 172 having positive and negative power, respectively, in the auxiliary scanning direction.

As shown in FIG. 5, the polygonal mirror 480 is driven by a mirror motor 471 (fixed in the casing 1), and rotates clockwise from the viewpoint of FIG. 4. Furthermore, as shown in FIG. 3, the polygonal mirror 480 is isolated from the atmosphere by a cup-like polygon cover 473 in order to prevent isolate sound due to rotations, and to avoid damage of the mirror surface from collisions with dust or debris in the air.

An optical path opening 473e is formed at the side of the polygon cover 473, ad a cover glass 475 is fitted in the optical path opening. The main flux transmitted through the cylindrical lens 170 enters the cover through the cover glass 475, is deflected by the polygonal mirror 480, and is directed outward, passing through the cover glass 475. A sensor block 476 containing a sensor for detecting a mark M attached to the top surface of the polygonal mirror 480 is provided on the top surface of the polygon cover 473.

A polygonal mirror may have facial errors in the main scanning direction on the reflection surfaces produced during manufacturing. This manufacturing error is often uneven between the respective reflection surfaces. In the optical system of this embodiment, the error quantity of each surface of the polygonal mirror 480 is measured and stored in a memory (not shown, and provided to the laser drive circuit shown in FIG. 17) during the manufacture of the scanning optical device. By distinguishing which reflection surface of the polygonal mirror 480 is being used for scanning, according to the output of the sensor in the sensor block 476, at least the beam position and beam intensity may be corrected according to the error quantity inherent to each of reflection surfaces of the polygonal mirror 480.

As shown in FIG. 5, the main flux reflected by the polygonal mirror 480 passes through fθ lens 190 (an image forming optical system) and is reflected by a fold-over mirror 200 to the photoconductive drum 210, forming eight beam spots. The polygonal mirror 480, the fθ lens 190, and the fold-over mirror form a scanning optical system. The beam spots scan according to rotations of the polygonal mirror, forming eight scanning lines per scan on the photoconductive drum 21. The photoconductive drum 210 is driven and rotated in the direction of the arrow R in synchronization with the scanning of beam spots, to form an electrostatic latent image on the photoconductive drum 210. The latent image is transferred onto a sheet of paper by an known electronic photography process.

The fθ lens 190 includes first, second, third and fourth lenses 191, 193, 195, 197 from the polygonal mirror 480 side to the fold-over mirror 200 side, having negative, positive, positive and negative power in both the main scanning and auxiliary scanning directions, respectively. The combination of lenses 190 in the fθ lens elliptically re-images the light flux linearly formed in the auxiliary scanning direction at the polygonal mirror 480 on the photoconductive drum 210.

The first lens 191 of the fθ lens 190 is a negative lens having a negative power spherical surface on the polygonal mirror 480 side, and a cylindrical surface having negative power only in the auxiliary scanning direction on the fold-over mirror 200 side. The first lens 191 has a comparatively intensive negative power in the auxiliary scanning direction and a comparative weak negative power in the main scanning direction.

The second lens 193 of the fθ lens 190 is a meniscus-shaped toric lens having a convex-spherical surface on the polygonal mirror 480 side and a positive toric surface on the fold-over mirror 200 side. The second lens 193 has comparatively intensive positive power in the auxiliary scanning direction along and comparative weak positive power in the main scanning direction.

The third lens 195 is a meniscus positive lens having two spherical surfaces. The fourth lens 197 is a meniscus lens spherical on both sides. The fourth lens 197 has intensive negative power on the polygonal mirror 480 side and weak positive power on the fold-over mirror 200 side. The four lenses of the fθ lens 190 are fixed on a single lens rack 280 as shown in FIG. 5 and FIG. 4.

The X axis in FIG. 3 through FIG. 6 is an axis parallel to the optical axis of the fθ lens 190, and the Y and Z axes are axes orthogonal to each other in the plane perpendicular to the X axis. The Y axis is coincident with the main scanning direction, and the Z axis is coincident with the auxiliary scanning direction in the optical path between the polygonal mirror 480 and fold-over mirror 200.

The main flux transmitted through the fθ lens 190 is detected by a synchronization sensor system 220 at each scan. The synchronization sensor system 220 includes a first mirror 221 positioned in the optical path between the fourth lens 197 of the fθ lens 190 and the fold-over lens 200, second and third mirrors 223, 225 for reflecting the main fluxes reflected by the first mirror 221, and a synchronization light sensor 230 which receives the light fluxes introduced by the mirrors 221, 223, 225. The synchronization light senor 230 is disposed at a position optically equivalent to the position of the photoconductive drum 210. The eight beams sequentially strike the synchronization light sensor 230 in line with scanning, and eight pulses are output from the synchronization light sensor 230 per scan. As the pulses are detected by the synchronization light sensor 230, image data equivalent to one line is transferred, from the printer using the scanning optical system, to the laser drive circuit (shown in FIG. 17), which drives the semiconductor lasers 101 through 108 according to the pulses.

An image forming opening 11 which permits the main flux (including the eight individual fluxes) reflected by the fold-over mirror 20 to be transmitted to the photoconductive drum 210 is formed in the casing 1. A cover glass 201 is attached to the image forming opening 11.

An inspection opening 12 is formed behind the fold-over mirror 200. The inspection opening 12 is used when adjusting optical elements after the optical elements (excluding the fold-over mirror 200) are assembled. As shown in FIG. 5, the inspection opening 12 is closed by a cover plate 13 in normal use.

FIGS. 7 through 14 show components of the abovementioned scanning optical system in detail.

Figure 7:
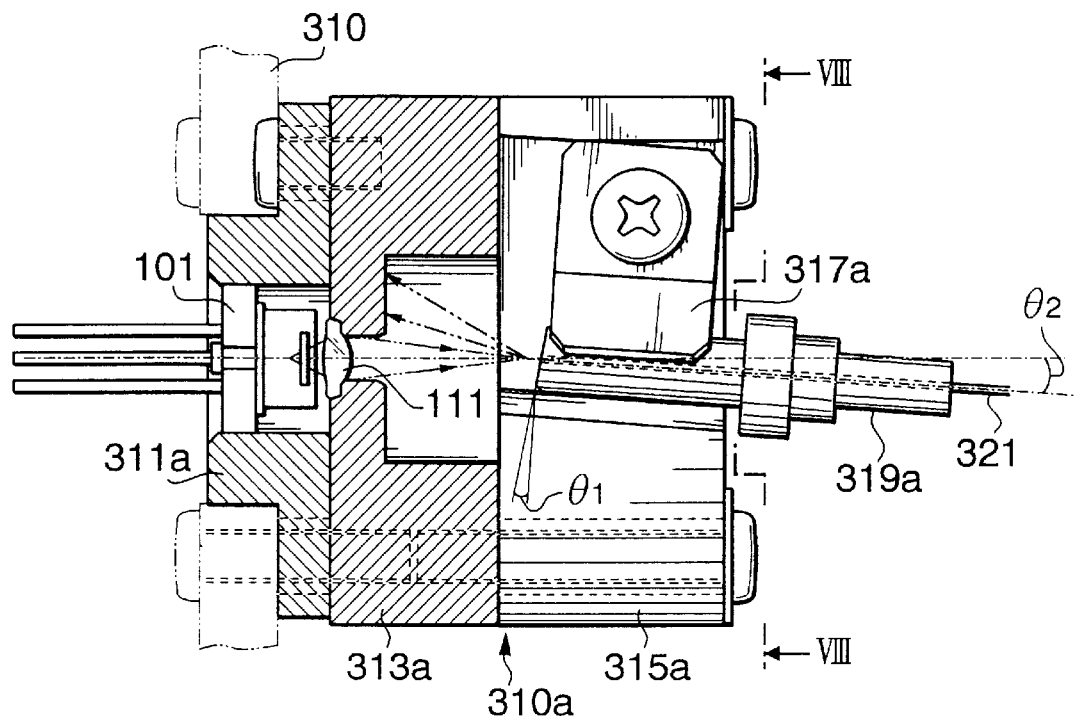
FIG. 7 is a cross-sectional view showing the details of a laser block portion of the device in FIG. 3.
Figure 8:
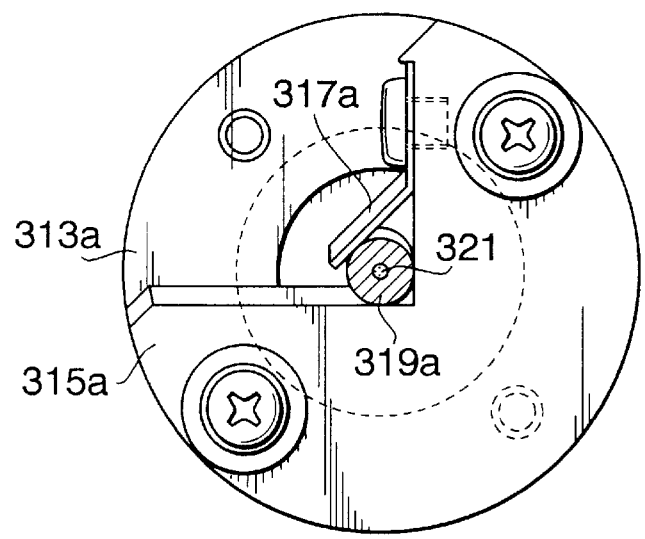
FIG. 8 is a front view taken along the line VIII—VIII in FIG. 7.

FIG. 7 is a cross-sectional view showing a detailed construction of the laser block 310a, and FIG. 8 is a front view of the laser block shown in FIG. 7, taken along the lines VIII—VIII in FIG. 7. All of the laser blocks 310a to 310h have the same construction, and a description is given of only the laser block 310a as a representative example. As shown in FIGS. 7 and 8, the laser block 310a includes three blocks: a semiconductor laser retaining member 311a for retaining the semiconductor laser 101, a coupling lens retaining member 313a for retaining the coupling lens 111, and a fiber fixing member 315a holding a fiber supporting member 319a. As shown in FIG. 8, the semiconductor laser retaining member 311a and coupling lens retaining member 313a are substantially cylindrical, and the fiber fixing member 315a is formed as a cylinder having substantially one quarter of the cylinder cut away along the axial direction, forming a base surface consisting of two walls orthogonal to each other.

The semiconductor laser retaining member 311a and fiber fixing member 315a are fixed with bolts from opposite sides of the coupling lens retaining member 313a. The semiconductor laser retaining member 311a is screwed to the supporting substrate 310. Accordingly, the three members 311a, 313a, and 315a are fixed at the supporting substrate 310 as an integral block. Furthermore, the fiber supporting member 319a is fixed in the corner of the cut-away wall surfaces of the fiber fixing member 315a by a fixing metal fitting 317a.

The dispersed light flux emitted from the semiconductor laser 101 is converged by the coupling lens 111 and directed into the optical fiber 321. The optical fiber 321 is inserted into a through hole formed along the center axis of the fiber supporting member 319a, and is fixed to the supporting member 319a with an adhesive agent.

In the example shown in FIG. 7, the surface of the incident end portion of the optical fiber 321 is cut at an angle with respect to the incident optical axis so that the end surface thereof is not orthogonal to the incident optical axis. Furthermore, the fiber supporting member 319a itself (i.e., the center axis thereof) is inclined with respect to the incident optical axis, so that a light beam bent at the surface of the incident end portion is directed to be parallel with the center axis of the optical fiber 321.

As shown in FIG. 7, since the surface of the incident end portion of the optical fiber 321 is inclined to be not orthogonal to the optical axis, the reflected laser flux at the incident end portion is directed away from the incident direction and away from the semiconductor laser 101. If the reflected light returns to the semiconductor laser 101, the oscillation of the semiconductor will be unstable and the oscillation mode is can change from a mono mode to a multi-mode, or the width of the oscillation wavelength can widen losing the desired diameter of the beam spot on the image plane, reducing the image forming accuracy. Using the described construction to prevent the return of any of the laser flux to the semiconductor laser 101, the semiconductor laser 101 is stable.

Figure 9:
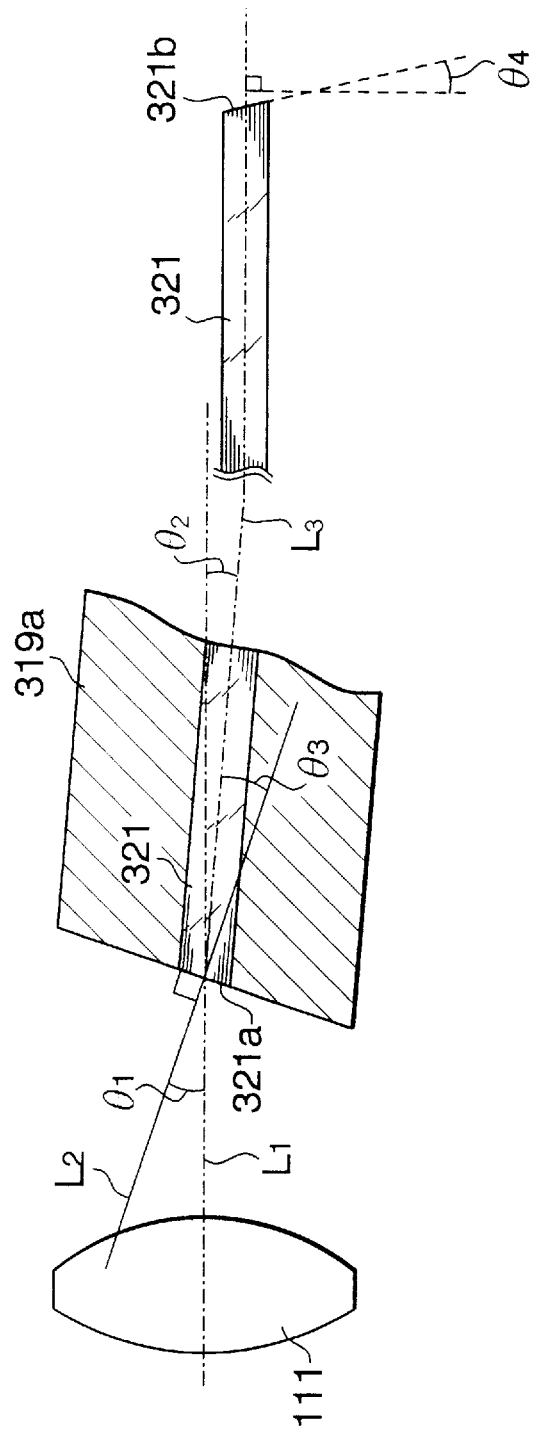
FIG. 9 is a schematic showing the relationship between the incident direction of light fluxes in the laser block and the angle at the incident end surface of optical fibers.

As shown in FIG. 9, θ1 is an angle formed by the optical axis L1 of the coupling lens 11 and a normal L2 of the incident end surface 321a of the optical fiber 321, θ2 is an angle formed by the optical axis L1 of the coupling lens 111 and the center axis L3 of the optical fiber 321, θ3 is an angle formed by the center axis L3 of the optical fiber 321 and the normal L2 of the incident end surface 321a, and n is the core refraction index of the optical fiber 321. If the angle θ1 is predetermined, then the remaining angles θ2 and θ3 are monistically defined according to two expressions:

$$\theta 3 = \sin^{-1}(\sin \theta 1)/n \qquad (1); \text{ and}$$

$$\theta 2 = \theta 1 - \theta 3 \qquad (2).$$

The optical fiber 321 is preferably polished integrally as attached to the fiber supporting member 319a at the incident end portion. Accordingly, the surface of the incident end portion of the fiber 321 is made flush with the end surface of the incident side of the fiber supporting body 319, and the surfaces are polished to form the normal L2 and the angle θ3 for the center axis of the fiber. Furthermore, the exit end surface 321b of the optical fiber 321 is diagonally cut at an angle θ to the plane orthogonal to the center axis of the optical fiber. With this construction, even though a portion of the light flux is reflected from the outgoing end surface of the optical fiber, the returning light returns along a path different from the transmission path from the semiconductor laser 101 side. Therefore, no returning light to the semiconductor laser 101 is generated.

Figure 10:
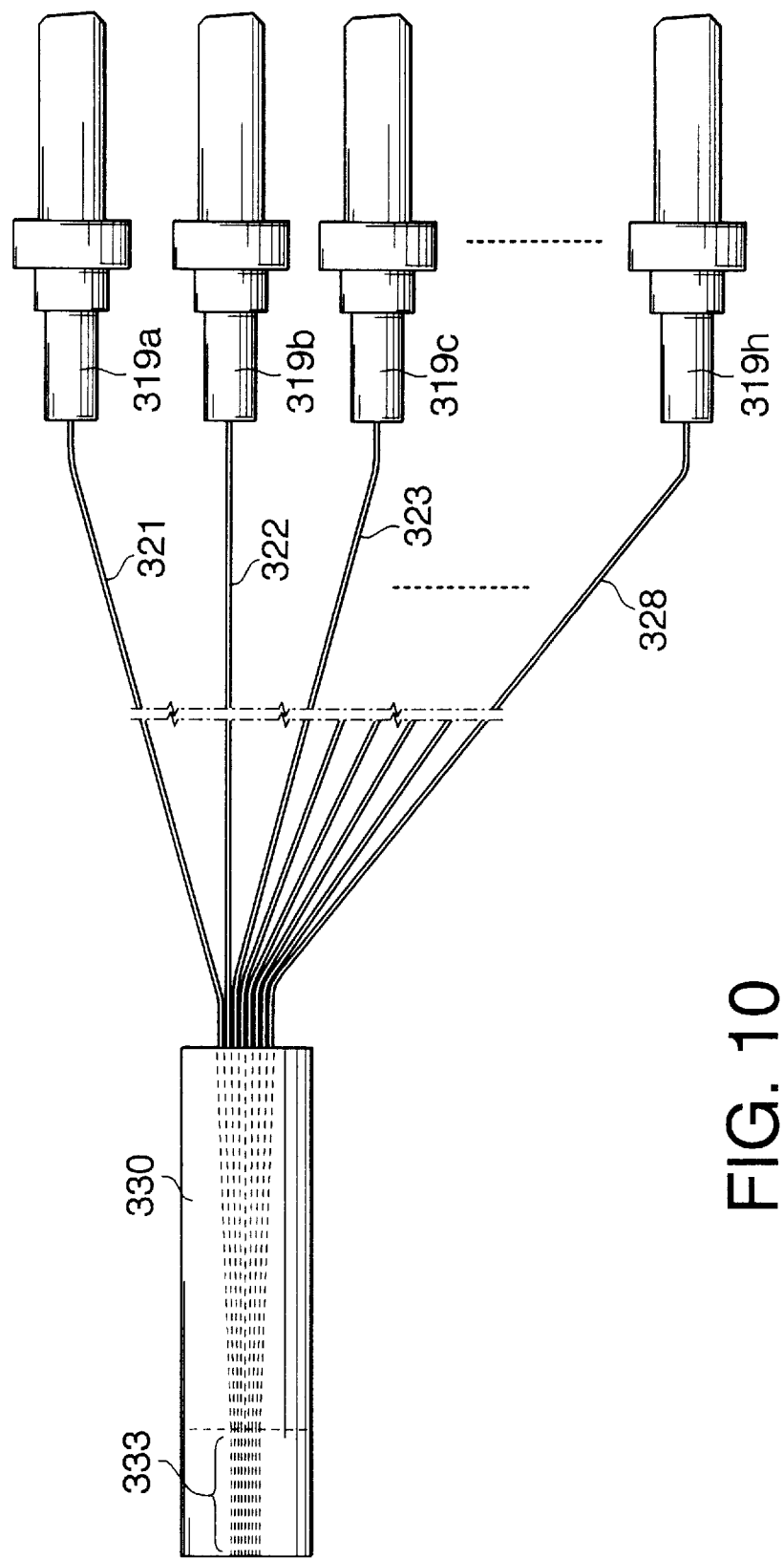
FIG. 10 is a plan view showing the construction from the fiber supporting member of the device shown in FIG. 3 to the fiber alignment block.
Figure 11:
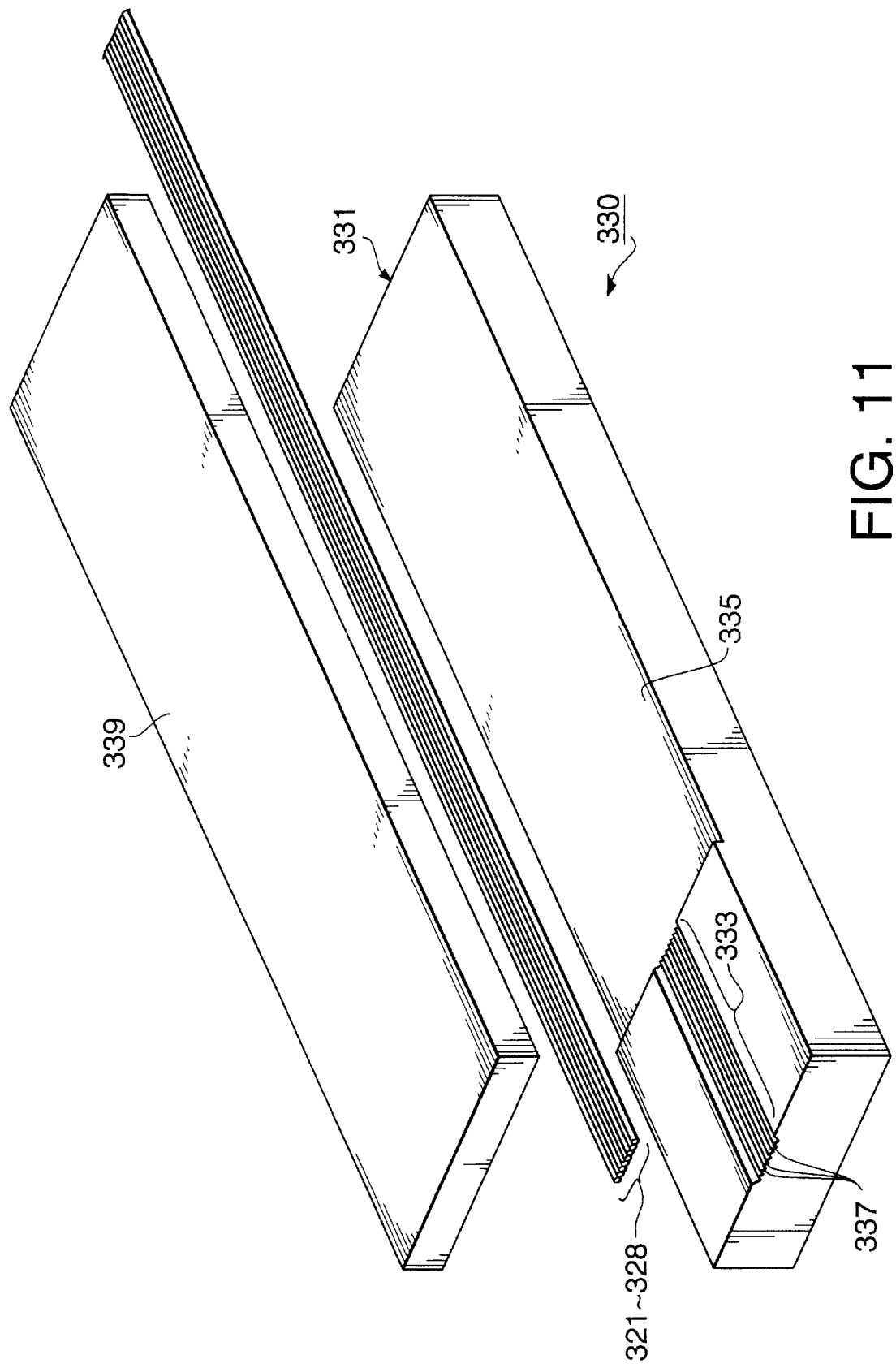
FIG. 11 is an exploded view of the fiber alignment block portion.

The exit end portions of the optical fibers 321 through 328 are aligned by a fiber alignment block 330 as shown in FIG. 10. The center axes of the respective optical fibers 321 through 328 are positioned in a straight row. FIG. 11 is an exploded view of the fiber alignment block 330. As shown in FIG. 11, an alignment portion 333 to position the exit end portions of the optical fibers 321 through 328 is formed in a body 331, and a pressing plate 339 presses the optical fibers 321 through 328 to the body 331. An introduction portion 335 is formed at the block entry side from the alignment portion 333 of the body 331 so as to have a staging gap entering into the pressing plate 339.

Figure 12:
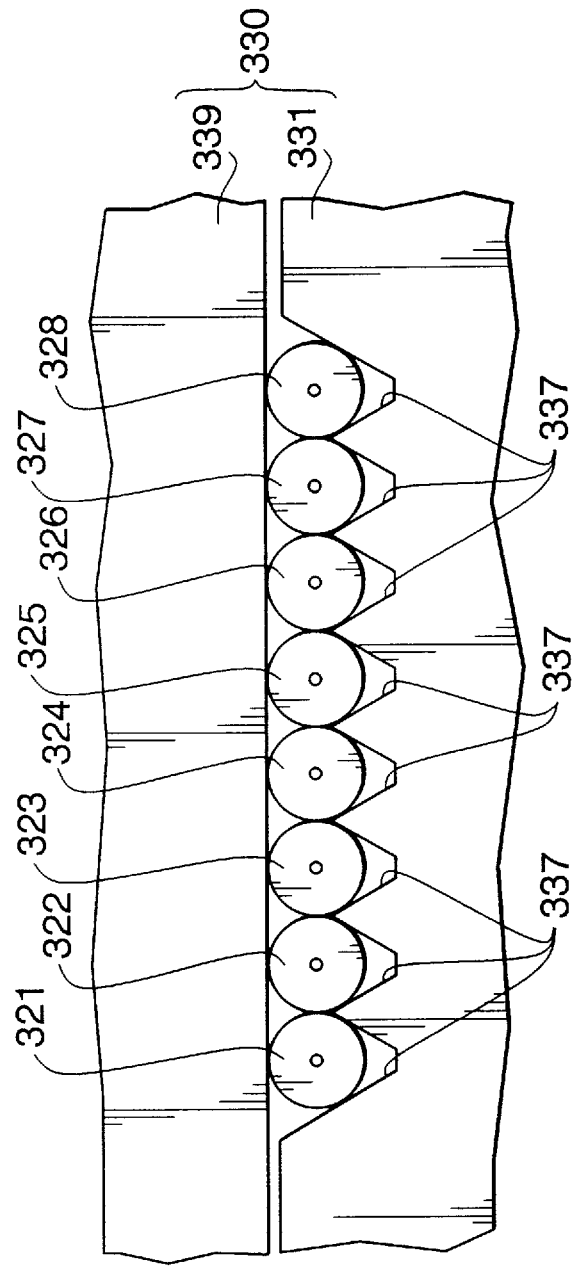
FIG. 12 is an enlarged front view of the fiber alignment block.

As shown in FIGS. 11 and 12 eight parallel V-shaped grooves 337 corresponding to the respective fibers 321 through 328 are formed at the alignment portion 333. During assembly, the optical fibers 321 through 328 are set in the V-shaped grooves, and are then are tightly pressed by the pressing plate 339. The optical fibers 321 through 328 and fiber alignment block 330 are integrally fixed by pouring an adhesive between the body 331 and the pressing plate 339.

Figure 13:
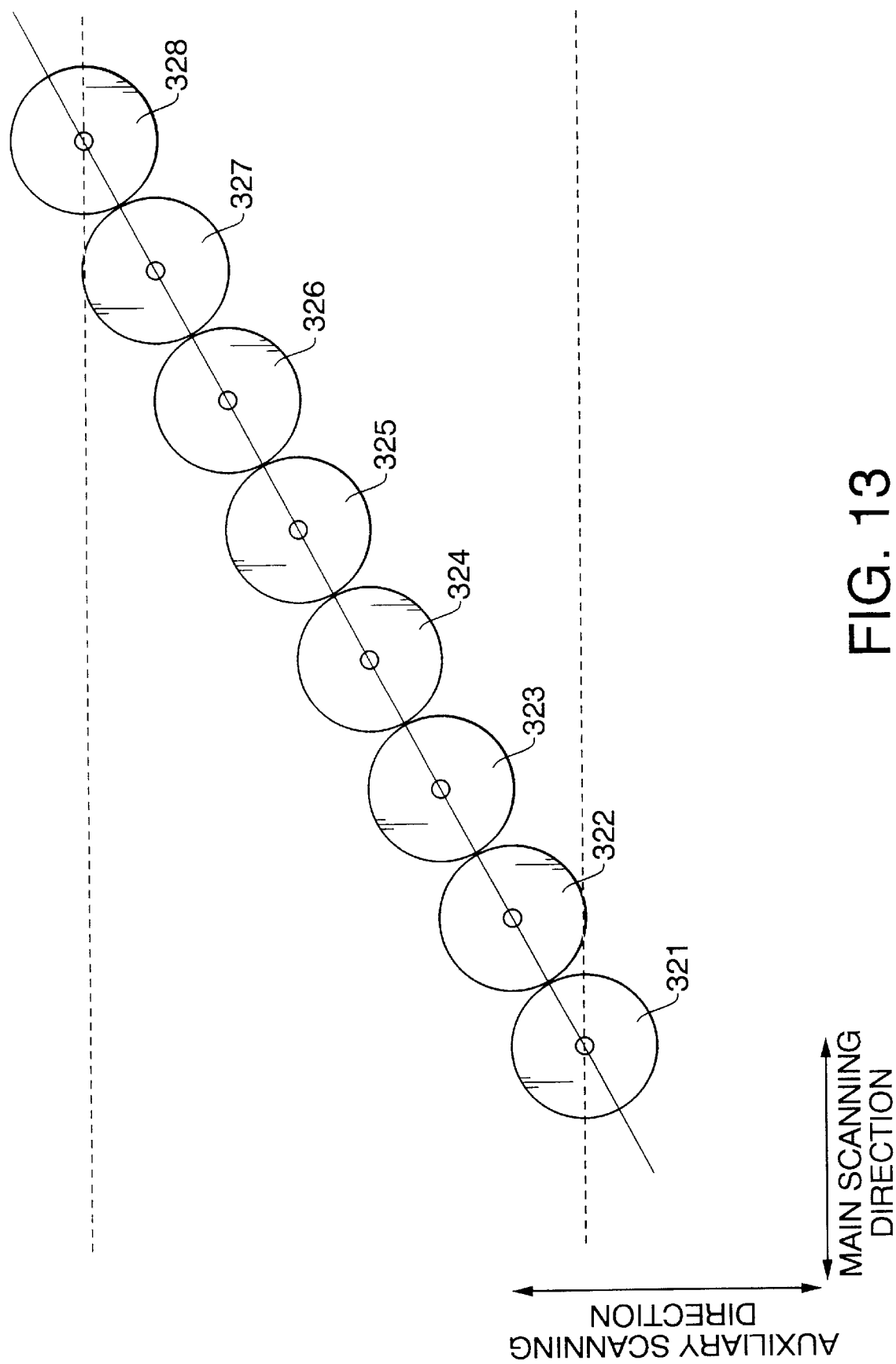
FIG. 13 is an explanatory view showing the array of fibers.

As shown in FIG. 13, the exit end surfaces of the optical fibers 321 through 328 retained at the fiber alignment block 330 are, arranged so that their center axes are in a straight row. The fiber alignment block 330 is retained by a holder (not shown) and is diagonally set, so that the straight line connecting the center axes of the fibers 321 trough 328 forms a predetermined angle with respect to the main scanning direction. At the predetermined angle, the beam spots on the photoconductive drum 210 form an array, separated from each other by a predetermined distance in the main scanning direction and in the auxiliary scanning direction.

Figure 14:
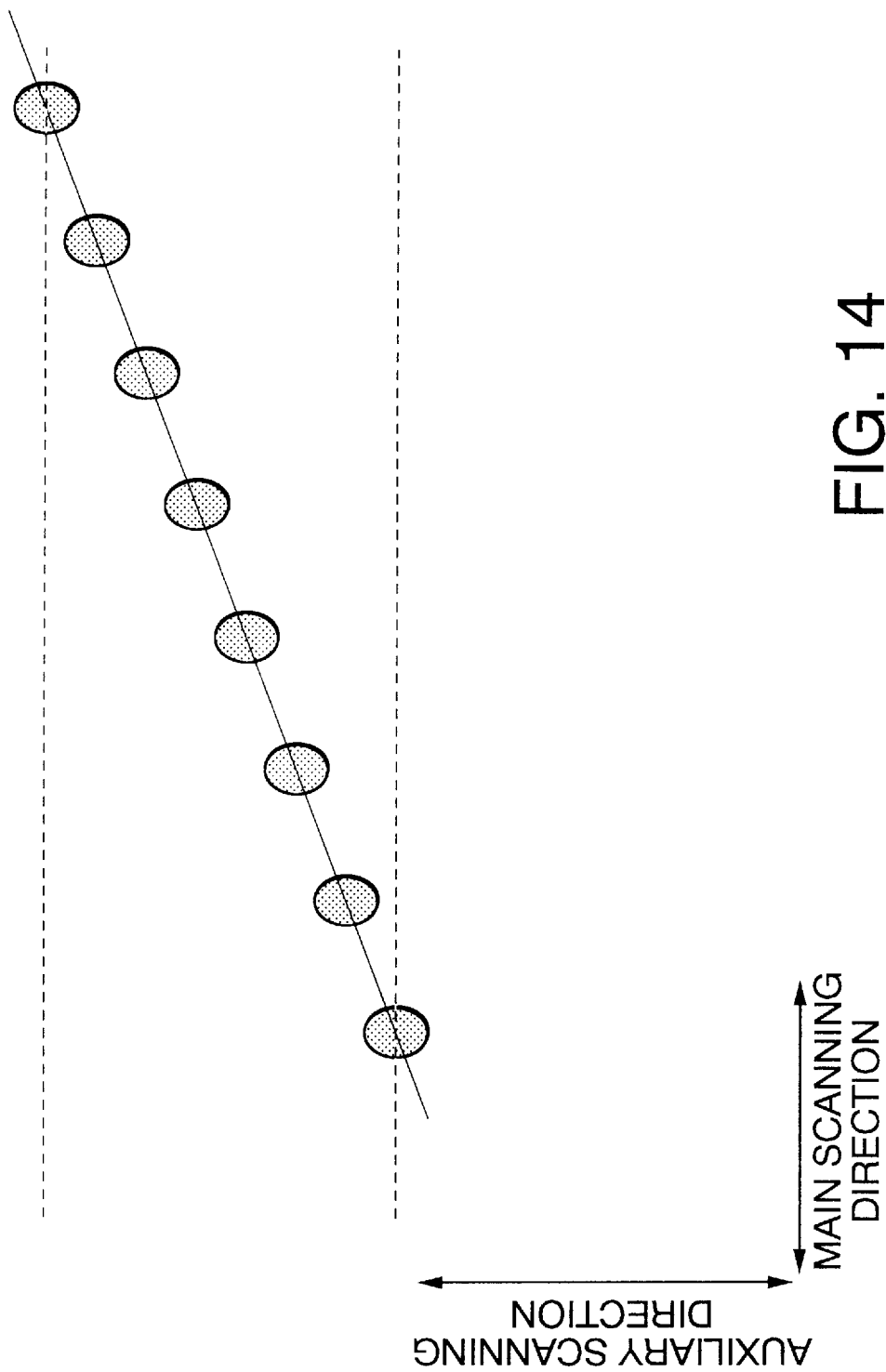
FIG. 14 is explanatory view showing the array of beam spots on the photoconductive drum.

FIG. 14 shows the array of beam spots on the photoconductive drum 210. If the end surfaces of the optical fibers 321 through 328 (corresponding to object points) are arrayed as shown in FIG. 13, the beam spots form with their centers are placed in a straight line. The straight line connecting the centers forms a predetermined angle with respect to the main scanning direction. Specifically, the centers of the beam spots are separated by a predetermined distance in the auxiliary scanning direction such that the scan lines formed in the main scanning direction are exactly adjacent (or slightly overlapped).

FIG. 15 is a block diagram showing a laser drive circuit, employed in the first and second embodiments, for controlling the laser light source 100 to output laser fluxes corresponding to information to be printed, and for controlling the power of the laser fluxes. As described for the first and second embodiments, the laser light source 100 has eight semiconductor lasers 101 through 108. Thus, if all of the semiconductor lasers 101 through 108 were turned ON, eight beam spots would be illuminated on the light receiving surface 150a of the APC sensor system 150. However, when the power of the laser flux is being controlled, since only the semiconductor laser being controlled is made to emit light, only one beam spot at a time is illuminated. The current signal generated at the APC sensor system 150 in accordance with the intensity of a beam spot is output as a voltage signal, and amplified by an amplifier 22 and guided to the corresponding semiconductor laser control circuits 451 through 458 via eight switches SW1, SW2 . . . SW8 in a switch group when the corresponding switch is closed. The eight switches SW1, SW2 . . . SW8 are switched under the control of a printing command signal/timing signal generating circuit 410. For example, when the output of the first semiconductor laser 101 is to be controlled, the corresponding first switch SW1 is closed.

Each one of eight semiconductor laser control circuits 451, 452 . . . 458 has the same arrangement. The voltage signal output from amplifier 22 is input via the switches SW1, SW2 . . . SW8 to a sample holding circuit 451a, and sample holding of the voltage signal is performed according to the control signal from the printing command signal/timing signal generating circuit 410. The voltage signal is input into a differential amplifier 451c. The differential amplifier 451c is connected to a reference voltage generating circuit 451b, and generates a corrected voltage signal corresponding to the difference between the reference voltage signal (input from a reference voltage generating circuit 451b) and the voltage input from the sample holding circuit 451a. The corrected voltage signal is converted into a current signal at a laser control circuit 451d and the current signal is supplied to the corresponding semiconductor laser 101, 102 . . . 108. The laser control circuit 451d not only performs the conversion to current signals, but also performs the switching of the current to the semiconductor laser according to the printing command signal.

For example, if the power of first semiconductor laser 101 is to be controlled, only the first switch SW1 is closed (and a switch in corresponding laser control circuit 451d is activated) and the power of the laser flux output from the first semiconductor laser 101 is controlled at a preset value according to the difference between the voltage signal input via first switch SW1 to the semiconductor laser control circuit 451 (i.e., the signal corresponding to the laser power of first semiconductor laser 101) and the reference voltage signal.

Next, the first switch SW1 is opened (and a switch in corresponding laser control circuit 451d is deactivated) and second switch SW2 is closed (and a switch in corresponding laser control circuit 451d is activated). The control is then performed, in the same manner as described above, to control the output power of second semiconductor laser 102. At this time, the output power of the semiconductor laser 101 is retained by the sample holding circuit 451a of semiconductor laser 101 in a hold condition, in order to preserve the power immediately before the switches are opened. The output power of the other semiconductor lasers are subsequently controlled in the same manner.

The above-described control of the power of the laser flux can be performed, for example, every time a new recording sheet is set in the laser printer, or every time the laser flux is main scanned across the photoconductive drum. In either case, the control of the power of the laser flux is performed according to the timing signal output from printing command signal/timing signal generating circuit 410 while main scanning is not being performed. For example, the control of the power of the laser flux is performed immediately before the laser flux is main scanned across the photoconductive drum.

During the main scan of the laser flux, that is, when the printing information is exposed onto the photoconductive drum, the switches in the laser control circuits 451d are switched in accordance with the control signal output from printing command signal/timing signal generating circuit 410. Laser flux is thus output from the corresponding semiconductor laser 101, 102 . . . 108 and directed to the photoconductive drum in accordance with the control value preserved by the sample holding circuit 451a of the corresponding semiconductor laser.

As described above, with the first and second embodiments, since feedback control of laser light source 100 is performed upon detection of the power of the laser flux emitted from the collimator lens 140 so that the power is of a preset value, changes in the power of the laser flux due to environmental changes or changes over time of the transmission optical system 300 and the collimator lens 140 can be prevented, and the printing precision of the laser printer can be improved.

Figure 16:
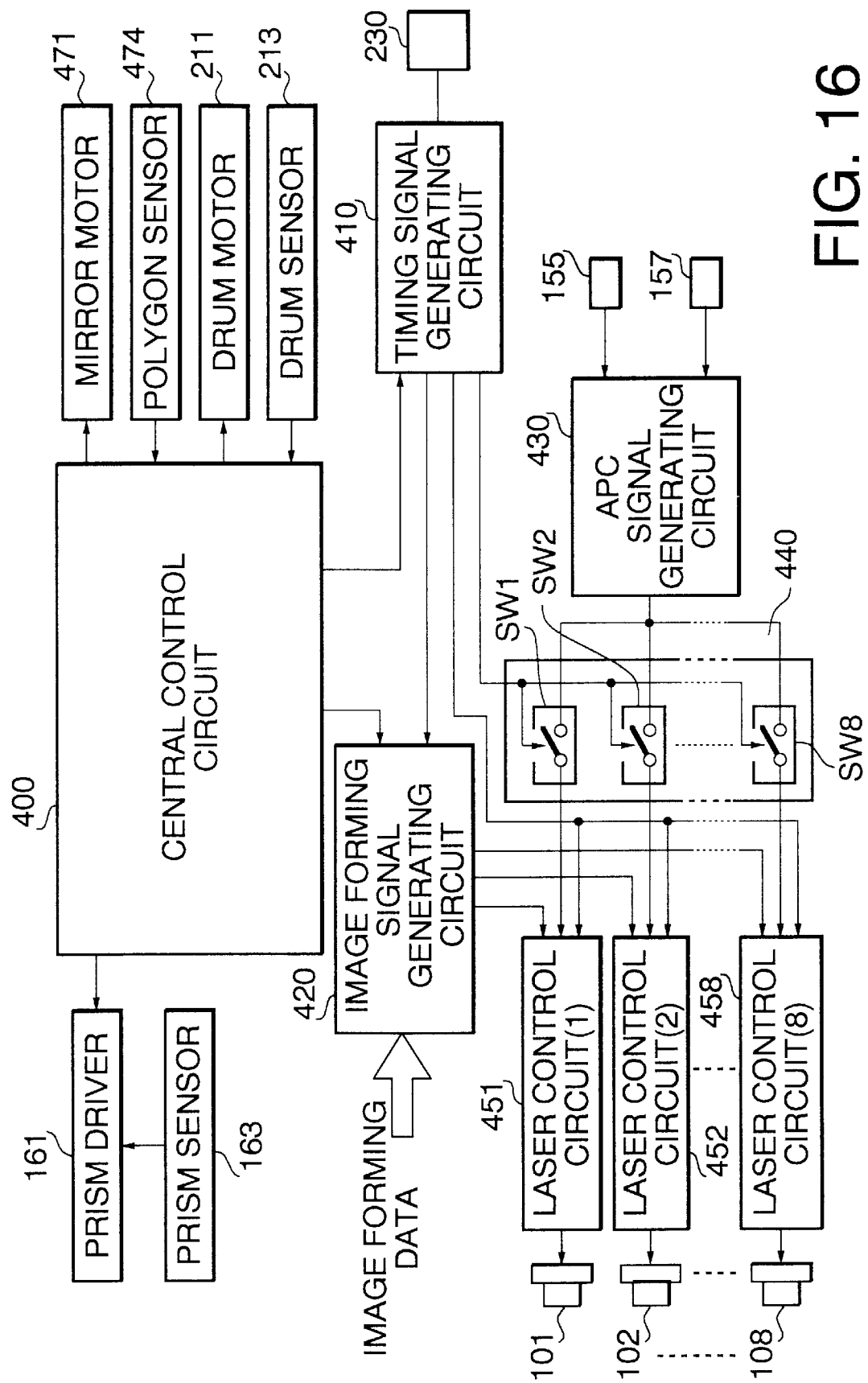
FIG. 16 is a block diagram showing a control system and laser control circuits of the third embodiment.

FIG. 16 is a block diagram showing a control system including a laser drive circuit of a scanning optical device according to the third embodiment. The control system includes: a central control circuit 400 which controls the entire device; a timing signal generating circuit 410 for generating timing signals per scan for setting and image forming; an image forming signal generating circuit 420 for converting image data input from the laser printer to image forming signals (image dot data per scan) and outputting the same; and laser control circuits 451 through 458 for driving and controlling semiconductor lasers 101 through 108 on the basis of the respective image forming signals. The control system further includes: an APC signal generating circuit 430 for generating APC signals on the basis of the output of the first and second light receiving elements 155 and 157; and a switching circuit 440 for distributing the detected APC signals to the respective laser control circuits 451 through 458.

The central control circuit 400 drives the mirror motor 471 to rotate the polygonal mirror 480, and further drives the drum motor 211, rotating the photoconductive drum 210 at a fixed speed. Furthermore, the central control circuit 400 determines which surface of the polygonal mirror is scanning on the basis of the detection signals from a polygon sensor 474 (shown in FIG. 16) arranged in the sensor block 476 (detecting the mark M), and detects unevenness in the rotation of the photoconductive drum 210 based on detection signals of a drum sensor 213 (shown only in FIG. 16) that detects the rotation speed of the photoconductive drum 210.

As described above, since facial errors of the polygonal mirror 480 and rotation unevenness of the photoconductive drum 210 appear as shifts in the auxiliary scanning direction of the beam spots at the drum 210, the angle of a dynamic prism 160 is changed to correct the influence of the error and unevenness. The amount of beam spot shifting on the photoconductive drum due to facial errors (i.e., inclinations) of each surface of the polygonal mirror 480 is measured and input into the central control circuit 400, and the adjusting angle to which the dynamic prism 160 must be moved to counterbalance the shifting of the beam spots for each reflection surface is obtained. Accordingly, the angle of the dynamic prism 160 for each reflecting surface of the polygonal mirror is set by controlling the prism drive portion 161 on the basis of at least the compensation angle. The adjusting angle of the dynamic prism 160 is detected by the prism sensor 163, and the prism drive portion 161 controls the dynamic prism in a closed loop based on at least the output of the sensor 163. Since the shifting of the beam spots due to facial errors (such as inclination) is known for each reflection surface, the adjusting angle is a reference adjusting angle of the dynamic prism 160 with respect to the corresponding reflection surface.

Conversely, since the unevenness in the rotation of the photoconductive drum is not a known error, but rather is generated at random, the central control circuit 400 controls the prism drive portion 161 to counterbalance the detected shifting of the beam spots (generated from the rotation uevenness) from the output of the drum sensor 213. Since the relationship between the adjusting angle of the dynamic prism 160 and the fluctuation of the deviation in the adjusting angle is non-linear, it is impossible to independently calculate a first adjusting angle to correct the shift due to the facial inclination, and another adjusting angle to correct the shift due to rotation unevenness. Therefore, the central control circuit 400 synthesizes an amount of beam spot shifting by adding the amount of shifting of the beam spot due to facial inclination on the corresponding reflection surface to the amount of shifting of the beam spot due to the rotation unevenness. The adjusting angle of the dynamic prism 160 to counterbalance of the synthesized amount of shifting of the beam spot is obtained thereby, and the prism drive portion 161 is controlled according to the synthesized amount of shifting.

With the above-described control, although the position of the scanning lines in the auxiliary scanning direction is not completely corrected by only a combination of the cylindrical lens and fθ lens, it is possible to accurately control the position of the scanning lines in the auxiliary scanning direction according to the shifting of the beam spots in the auxiliary scanning direction due to facial errors (such as inclination) of the polygonal mirror 480 and rotation unevenness of the photoconductive drum 210.

The timing signal generating circuit 410 generates three timing signals after a scanning reflection surface of the polygonal mirror 480 is changed over to the next reflection surface to scan.

The first timing signal is output to each of the laser control circuits 451 through 458 and to the switching circuit 440, and controls each of the semiconductor lasers 101 through 108 to independently emit light one after another in order to obtain the APC signals. The APC signal generating circuit 430 detects the outputs of each of the sequentially driven semiconductor lasers 101 through 108 from the first and second light receiving elements 155 and 157, and outputs APC signals for every semiconductor laser 101 through 108. The switching circuit 440 selects an output address, switching the APC signals outputted from the APC signal generating circuit 430 to the corresponding laser drive circuit in compliance with the first timing signal. For example, a switch SW1 is closed for a fixed period of time as the first semiconductor laser 101 is emitting light, and the APC signals output at this time are inputted in the first laser control circuit 451, similarly for the second semiconductor laser 101, switch SW2, and second laser control circuit 452, and so on. The respective laser control circuits 451 through 458 control the gain on the basis of the input APC signals to control the output of the semiconductor lasers to a reference level.

The second timing signal is output to each of the laser control circuits 451 through 458, and controls all of the semiconductor lasers 101 through 108 to emit light simultaneously to provide a horizontal synchronization signal. Since the main flux incident into the synchronization light sensor 230 from the semiconductor lasers 101 through 108 includes eight light fluxes separated from each other in the main scanning direction, the eight light fluxes reach the synchronization light sensor 230 from each of the semiconductor lasers 101 through 108 in sequence (i.e., according to different timing, although close together).

The third timing signal is output to the image forming signal generating circuit 420, and is a horizontal synchronization pulse (HS), generated per scanning line by detecting a signal output from the synchronization light sensor 230. The image forming signal generating circuit 420 supplies image forming signals to each of the laser control circuits 451 through 458, to begin image forming after a predetermined time period elapses following the input of the respective synchronization pulses.

Figure 17:
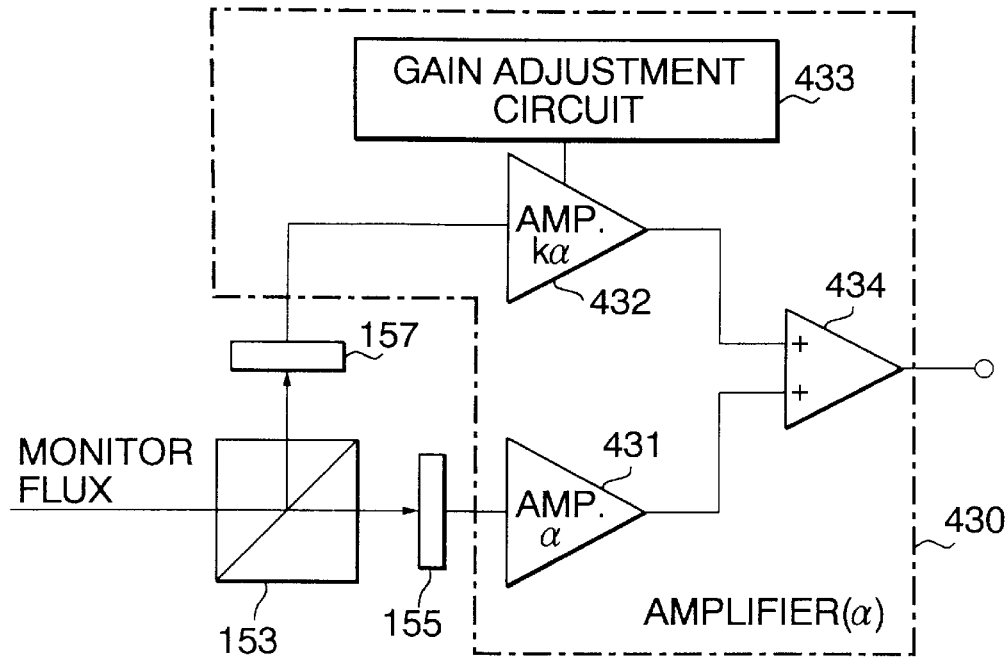
FIG. 17 is a block diagram showing the details of an APC signal generating circuit shown in FIG. 16.

The APC signal generating circuit 430 consists of, as shown in FIG. 17, a first amplifier 431, a second amplifier 431, a gain adjustment circuit 433, and an adder 434. The first amplifier 431 receives the output of the first light receiving element 155, corresponding to the P polarization constituent (of two linearly polarization constituents which pass through the beam splitter 144 and are separated by the polarization beam splitter 153), and outputs a signal amplified by an amplification ratio α. The second amplifier 432 receives the output of the second light receiving element 157, corresponding to the S polarization constituent (of two linearly polarization constituents as above), and outputs a signal amplified by an amplification ratio kα. The gain adjustment circuit 433 adjusts the gain of the second amplifier 432 by adjusting the coefficient k of the amplification ratio kα. The adder 434 adds the outputs of the first and second amplifiers 431 and 432 and outputs an signal which becomes a polarization-compensated intensity APC signal, i.e., a polarization-compensated feedback signal. The polarization beam splitter 153, the light receiving elements 155 and 157, and the APC signal generating circuit 430 constitute a polarization-compensating light receiving system, in combination with the central control circuit 400 as an automatic power control system.

The coefficient k of the gain adjusting circuit 433 may be defined in advance as a design parameter, or may be established device by device when assembling and adjusting the optical scanning devices. An APC signal S is determined by an expression:

$$S=K(Sp+k\cdot Ss) \qquad (3).$$

In this expression (3), the output voltages of the light receiving elements 155, 157 are Sp and Ss and are suitably amplified (K times). In the expression, as noted, the reference symbol K is a constant. In this example, K is 0.5. The coefficient k is obtained from an expression:

$$k=k1\cdot k2 \qquad (4).$$

In this expression (4), k1=Mp/Ms and k2=Ps/Pp, where the light intensity of the monitor light flux when P polarized light is incident to the beam-splitter 144 is Mp, and the light intensity of the main light flux of the photoconductive drum 210 when P polarized light is incident to the beam splitter 144 is Pp. Furthermore, the light intensity of the monitor light flux when S polarized light is incident to the beam splitter 144 is Ms, and the light intensity of the main light flux on the photoconductive drum 210 when S polarized light is incident to the beam splitter 144 is Ps. That is, Mp and Ms are light intensities of the transmitted light (monitor light flux) when two linearly polarized light fluxes (having electric field vector vibration directions orthogonal to each other) are made incident into the beam splitter 144, and Ps and Pp are light intensities of the reflected light (main light flux) on the image plane in the same circumstance.

The coefficient k is calculated from the optical design data once an optical system of the device is determined. Furthermore, k may be experimentally obtained by using an optical system constructed as a sample of the device, or may be adjusted and/or established for every device. It is possible to make a representative measurement by utilizing P polarized light (which oscillates in the incident plane of the light splitting surface of the beam splitter 144) and S polarized light (which oscillates on the plane orthogonal to the incident plane of the light splitting surface of the beam splitter 144). The ratios Mp/Ms and Ps/Pp are calculated as design values, or are obtained in advance as measured data. By controlling the power of the semiconductor lasers 101 through 108 on the basis of the abovementioned corrected signal S, it is possible to control the light intensity of beam spots on the photoconductive drum 210.

Furthermore, if it is assumed that the splitting characteristic of a polarization beam splitter 153 is complete, the constituent which is made incident to beam splitter 144 as P polarized light is detected by only the first light receiving element 155, and the constituent which is made incident thereinto as S polarized light is detected by only the second light receiving element 157.

Figure 18:
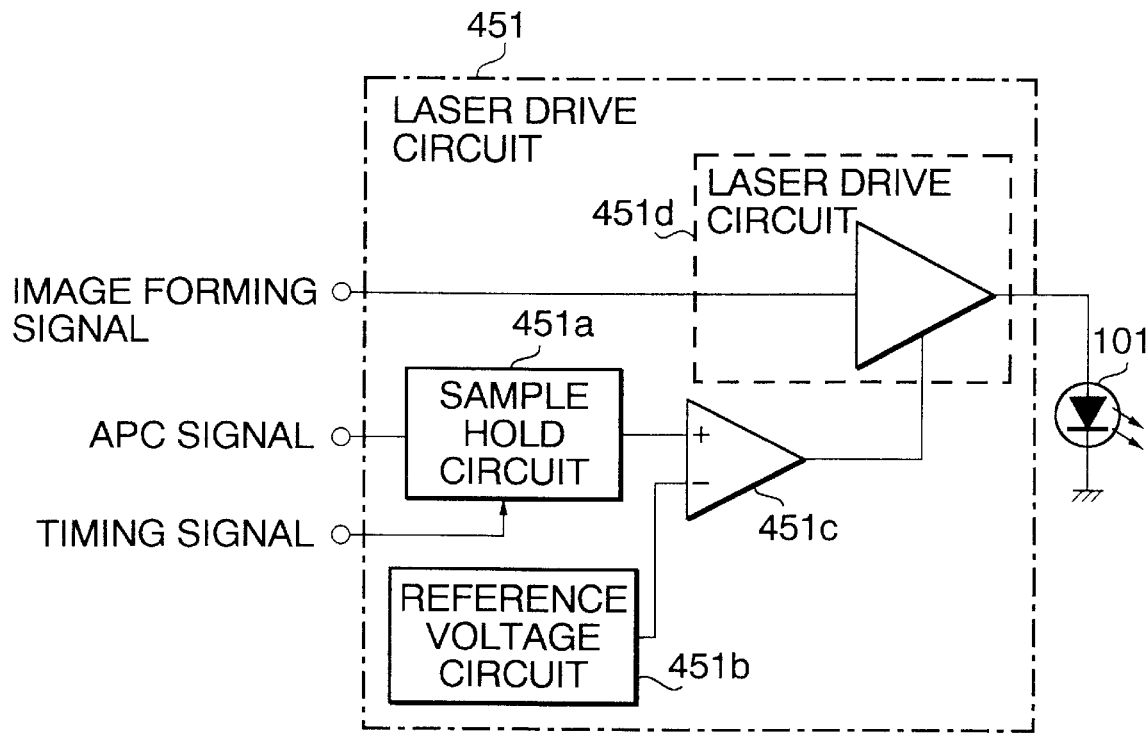
FIG. 18 is a block diagram showing the details of laser drive circuit shown in FIG. 16.

The construction of the laser control circuit 451 is as shown in FIG. 18. A sample hold circuit 451*a* takes in an APC signal outputted from the APC signal generating circuit 430, in synchronization with the closing of the switch SW1 according to a timing signal input from the timing signal generating circuit 410 and holds the APC signal. The reference voltage generating circuit 451*b* generates a reference voltage corresponding to a predetermined reference output of the semiconductor lasers 101 through 108.

The differential amplifier 451c calculates a difference between each held signal the reference voltage, and sets the gain of the laser control circuit 451d according to the differential signal obtained. The laser drive circuit 451d turns the semiconductor laser 101 ON or OFF based on the image forming signal inputted from the image forming signal generating circuit 420. However, drive voltage of laser drive circuit 451d is adjustable by the gain set by differential amplifier 451c.

The construction of the remaining laser drive circuits 452 through 458 is identical to that of the described laser control circuit 451. Accordingly, the output of the corresponding semiconductor lasers 102 through 108 is adjusted according to APC signal generating circuit 430.

With the above construction, the laser control circuit 451c controls the output of the semiconductor lasers 101 through 108 so that the intensity of the beam spots on the photoconductive drum 210 surface is at a predetermined reference level.

Figure 19:
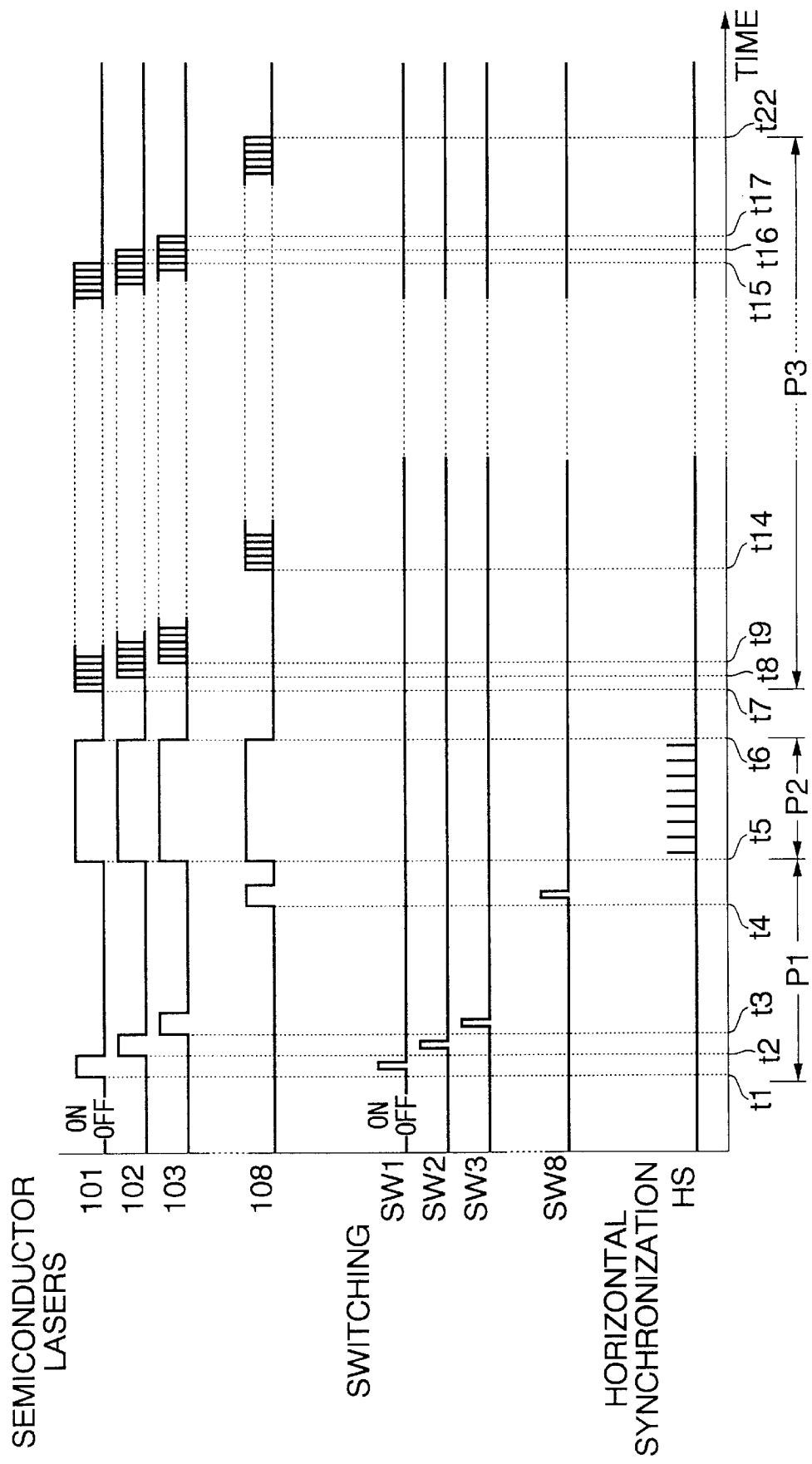
FIG. 19 is a timing chart showing the operations of a scanning optical device according to the third embodiment of the invention.

FIG. 19 is a timing chart showing the timing of the control system as described above in one scan, and shows ON-OFF states of the semiconductor lasers 101 through 108, ON-OFF states of the respective switches SW1 through SW8 of the switching circuit 440, and output timing of the horizontal synchronization signal HS.

The time of one scan is divided into a first period P1 during which the outputs of the respective semiconductor lasers are adjusted, a second period P2 during which the horizontal synchronization signal HS is detected, and a third period P3 during which a pattern is actually scanned onto the photoconductive drum 210.

In the first period P1, the semiconductor lasers 101 through 108 are sequentially turned ON, causing corresponding switches (SW1 through SW8) in the switching circuit 440 to be turned ON within the ON duration of the respective semiconductor lasers 101 through 108, and whereby an APC signal (output from the APC signal generating circuit 430) is input into the corresponding laser control circuit 451 through 458. For example, the semiconductor laser 101 is turned ON and emits a laser flux between the times t1 and t2, the semiconductor laser 102 is turned ON and emits a laser flux between the times t2 and t3, and so on. Within these ON durations, the corresponding switches (SW1, SW2, and so on) are respectively turned ON(i.e closed). The corresponding laser control circuits 451 through 458 adjust the control level of the drive voltage so that the light quantity on the photoconductive drum 210 is at the predetermined reference level.

In the second period P2, the eight semiconductor lasers 101 through 108 are turned ON and each simultaneously emits a laser flux between the times t5 and the horizontal synchronization light sensor 230, generating the horizontal synchronization pulse HS (including eight horizontal synchronization pulses per scan).

In the third period P3, after a predetermined duration elapses from the horizontal synchronization pulse HS, the semiconductor lasers 101 through 108 are controlled ON and OFF on the basis of image forming signals at a predetermined timing to scan a pattern onto the photoconductive drum 210. The first scanning line of the simultaneously formed eight scanning lines is formed by controlling the semiconductor laser 101 from the time t7 through t15. Similarly, the second scanning lines are formed from the times t8 through t16, the third scanning line from the times t9 through t17, and the eighth scanning lines from the times t14 through t22 by controlling the respective semiconductor lasers 102, 103, and 108 (the timing for the fourth through seventh lines is not shown). As previously described, the beam spots formed by the light fluxes from the respective semiconductor lasers 101 through 108 are separated by a predetermined distance from each other in the main scanning direction. Therefore, the lines are aligned by starting the formation of subsequent scanning lines following a predetermined duration from the starting of the formation of the previous one (i.e., the duration separating times t7 and t8, t8 and t9, and so on).

The APC signal generating circuit 430 is not limited to a construction for setting gain electrically (as shown in FIG. 17) and may be alternatively provided with a flux reducing element for adjusting at least one of the light fluxes incident into the first and second light receiving elements 155 and 157.

Figure 20:
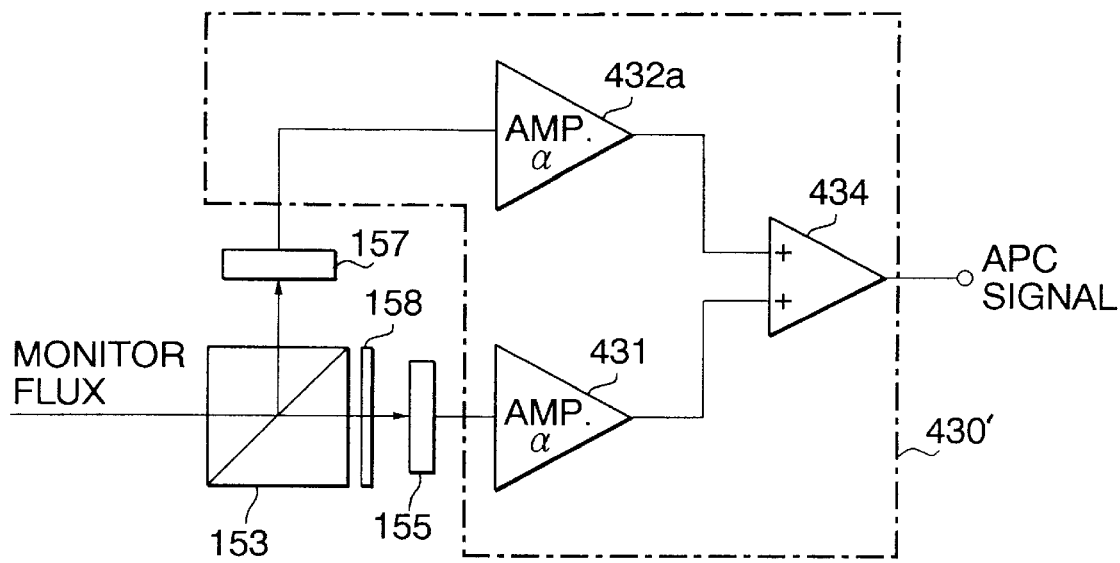
FIG. 20 is a block diagram showing an alternative APC signal generating circuit.

For example, in the case of alternative APC signal generating circuit 430' shown in FIG. 20, a filter 158 is inserted as a flux reducing element between, for example, the light receiving element 155 and the polarization beam splitter 153. In this case, the balance of the light receiving quantity is optically adjusted (instead of electrically with the APC signal generating circuit 430). Furthermore, in this case, the transmissivity of the filter 158 is determined so that the level of the APC signal and the light intensity on the photoconductive drum 210 have a known correlation irrespective of the polarization states of the light fluxes entering the beam splitter 144. The filter 158 may be an ND filter, a polarizer, or other flux reducing element. When an ND filter is used as the filter 158, a plurality of filters having different transmissivities are prepared, and when the APC signal generating circuit is adjusted at assembly, a filter 158 having a suitable transmissivity is selected. Furthermore, in a case where a polarizer is used as the filter 158, the transmitted light quantity is adjusted by causing the polarizer to rotate about the optical axis, and the polarizer is secured at a position where a suitable light quantity is found.

Figure 21:
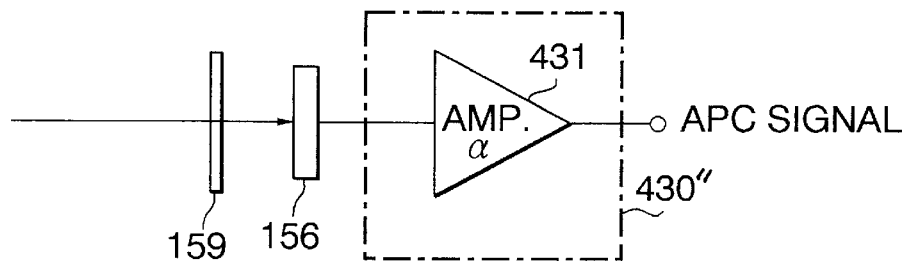
FIG. 21 is a block diagram showing another alternative APC signal generating circuit.

FIG. 21 shows still another alternative APC signal generating circuit 430". With the APC signal generating circuit 430", a polarizer 159 is inserted between the beam splitter 144 and a single light receiving element 156. In this alternative, the polarizer 159 is rotated to a position where the angle of the transmission axis determines the relationship between the APC signal and light intensity on an image plane for a fixed light emitting quantity of the semiconductor lasers 101 through 108, regardless of the polarization states of light fluxes incident into the beam splitter 144. That is, the angle of the transmission axis of the polarizer is determined so that the influence of the polarization dependency of the beam splitter 144 and the influence of the polarization characteristics of the optical system at the main flux side are excluded.

Figure 22:
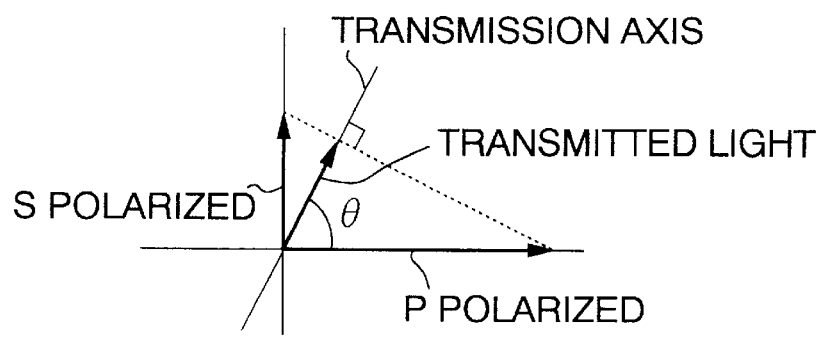
FIG. 22 is a graph showing the actions of a polarizer.

In FIG. 22, in order to simplify the initial description, it is assumed that the transmission and reflection ratios of an optical system on the main flux side have no polarization dependency. Using this assumption, as shown in FIG. 22, the angle θ formed by the transmission axis of a polarizer from the axial direction of P polarized light within the incident plane of the beam splitter (in the plane perpendicular to the transmitting direction of the light fluxes) is obtained by an expression:

$$\theta = \tan^{-1}(Sp/Ss) \qquad (5)$$

In this assumption, since the intensity of each polarization constituent which passes through the polarizer 159 becomes a projection along the transmitting axes of the respective polarization constituents, the optical amplitude of the P polarized light reaching the light receiving element is cos(θ)

times the intensity and the optical amplitude of the S polarized light is sin(θ) times the intensity. By setting the angle of the polarizer 159 as described above, the amplitude intensities of both the P and S polarized light fluxes projected onto the transmission axis are equal, and the light quantity of light fluxes incident into the beam splitter 144 are detected without the influence of the polarization dependency of the beam splitter 144.

However, without assuming that the transmission and reflection ratios of an optical system on the main flux side have no polarization dependency (as in the construction shown in FIG. 22), it is possible to compensate for the polarization dependency of the optical elements between the beam splitter 144 and the photoconductive drum 210. In order to achieve this, the angle θ of the transmission axis of the polarizer 159 is set to meet a condition:

$$\theta = \tan^{-1}\sqrt{k} \quad . \tag{6}$$

To compensate for the polarization dependency of the optical elements between the beam splitter 144 and the photoconductive drum 210, k is defined by the expression (4) as above, k=k1·k2.

In this case, as previously noted, k1 is (Mp/Ms) and k2 is (Ps/Pp), where the light intensity of the monitor light flux when P polarized light is incident to the beam splitter 144 is Mp, the light intensity of the main light flux of the photoconductive drum 210 when P polarized light is incident to the beam splitter 144 is Pp, the light intensity of the monitor light flux when S polarized light is incident to the beam splitter 144 is Ms, and the light intensity of the main light flux On the photoconductive drum 210 when S polarized light is incident to the beam splitter 144 is Ps.

Experimental Results

FIGS. 23 through 28 describe experimental results which verify the efficacy of the third embodiment of a light intensity controlling device according to the invention.

As described above, since optical fibers generally change the polarization state of the incident light, and the change of the polarization states are significantly changed by the positioning and arrangement of the optical fibers, the polarization states of light fluxes exiting the optical fibers differ from each other even though the polarization direction of light source semiconductor lasers are aligned in the same direction at the incident side. The polarization states may change according to changes of the orientation and bending state of optical fibers, changes in the environment, or over time.

Figure 23:
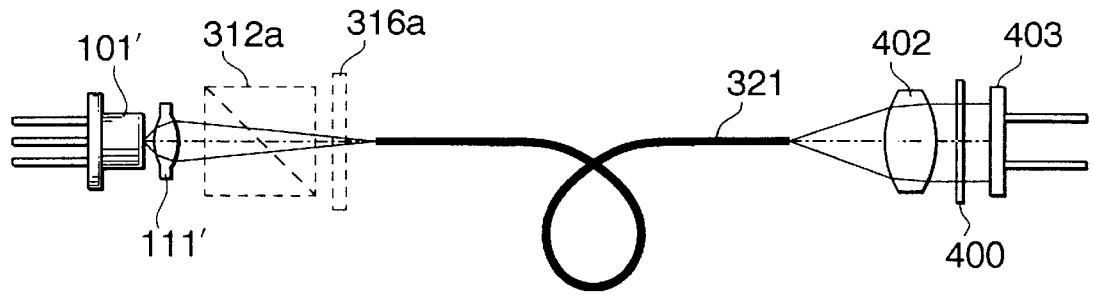
FIG. 23 is an explanatory view showing an optical system for measuring the polarization states of the outgoing light from the optical fibers.

FIG. 23 shows an optical system for measuring changes of the polarization states of light being transmitted in optical fibers. A light flux coming from a semiconductor laser 101' (in this case, corresponding to any of the semiconductor lasers 101 through 108 of the embodiments) are converged by a coupling lens 111' and enter an optical fiber 321. The light flux exiting the optical fibers 321 is collimated by a collimator 402 and is made incident to a sensor 403 through a polarizer 400. Here, by measuring the output of a sensor 403 while rotating the polarizer 400, it is possible to determine the polarization states of the outgoing light. Here, a system containing a semiconductor laser 101 is shown as a representative example. However, it is possible to make a similar measurement in other types of systems as well.

Figure 24:
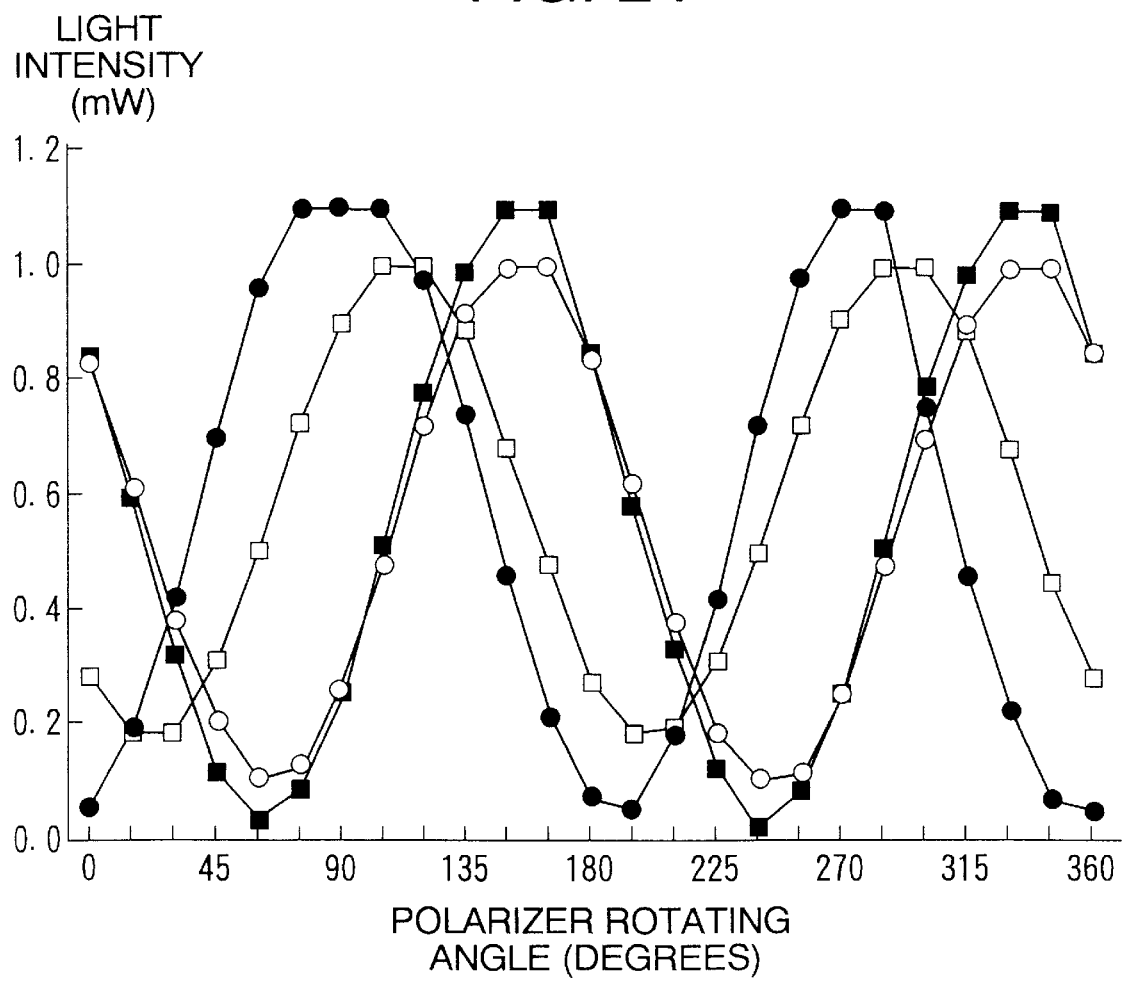
FIG. 24 is a graph showing measurements of the polarization states of six of the eight optical fibers.

FIG. 24 is a graph showing measurement results (using the system shown in FIG. 23) of changes in the polarization states of the exiting light from six optical fibers 321 when a linearly polarized light of the same polarization direction is made incident to the respective optical fibers. In FIG. 24, the abscissa shows a rotating angle (degrees) of the polarizer 400, and the ordinate shows a light intensity (mW) detected by a power meter connected to the sensor 403. A smaller fluctuation width of the output signifies a near circular polarization of exiting light, and a large fluctuation width of the output signifies a near linearpolarization. It can be seen in FIG. 24 that the polarization plane rotates while light is transmitted by optical fibers, i.e., optical rotatory power of optical fibers is observed. Furthermore, a combination having an inverted phase is observed, i.e., a combination in which the polarization directions are orthogonal to each other exists.

In order to measure how polarization states changed according to change in the orientation and bending state of the same optical fiber, a polarization beam splitter 312a and a λ/4 plate 316a (shown by a dashed line in FIG. 23) are inserted between the coupling lens 111 and optical fibers 321. Accordingly, circularly polarized light enters the optical fiber 321, and the output of the sensor 403 is measured while rotating the polarizer 400 as noted above.

Figure 25:
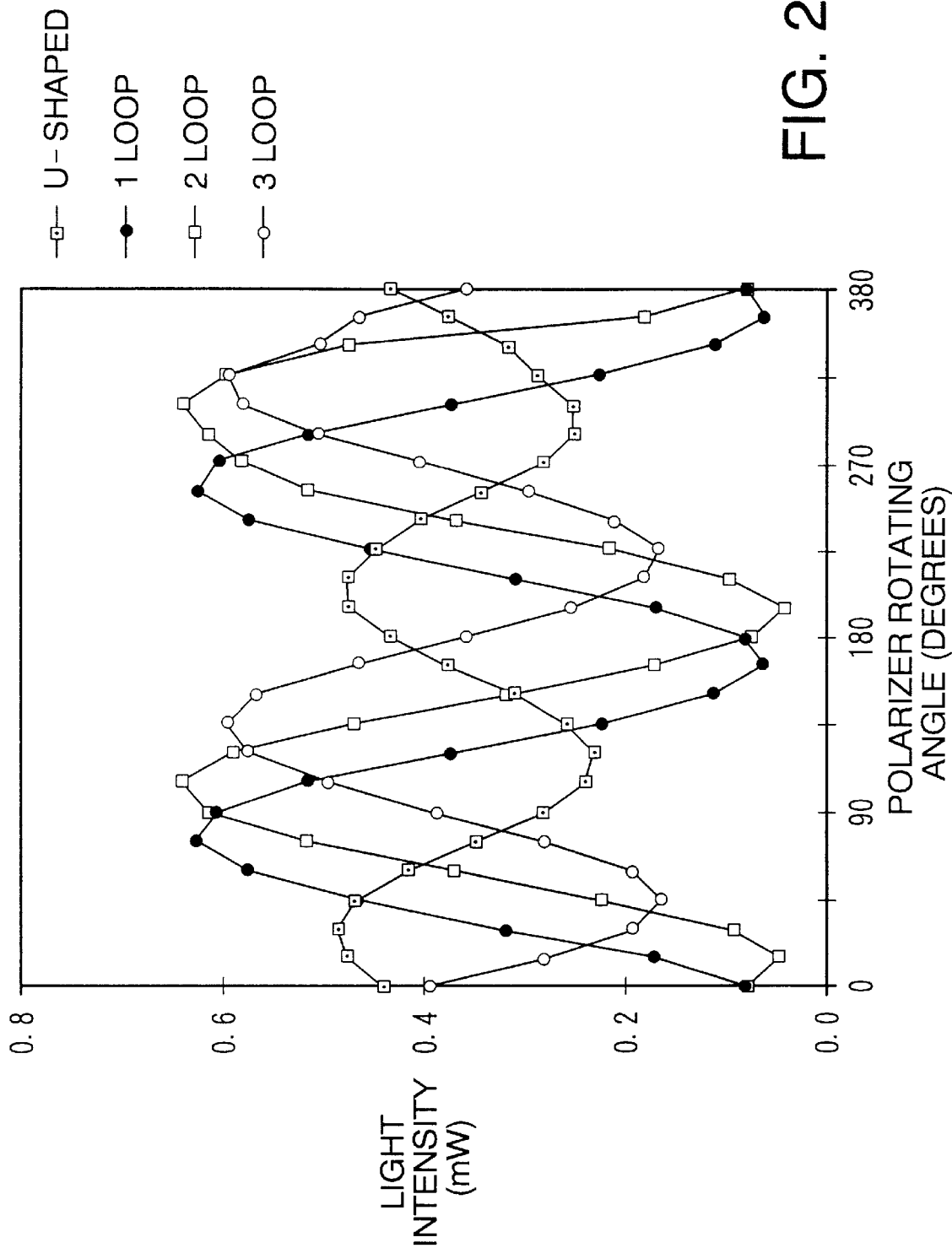
FIG. 25 is a graph showing measurements of changes of polarization due to curving and looping of optical fibers.
Figure 26:
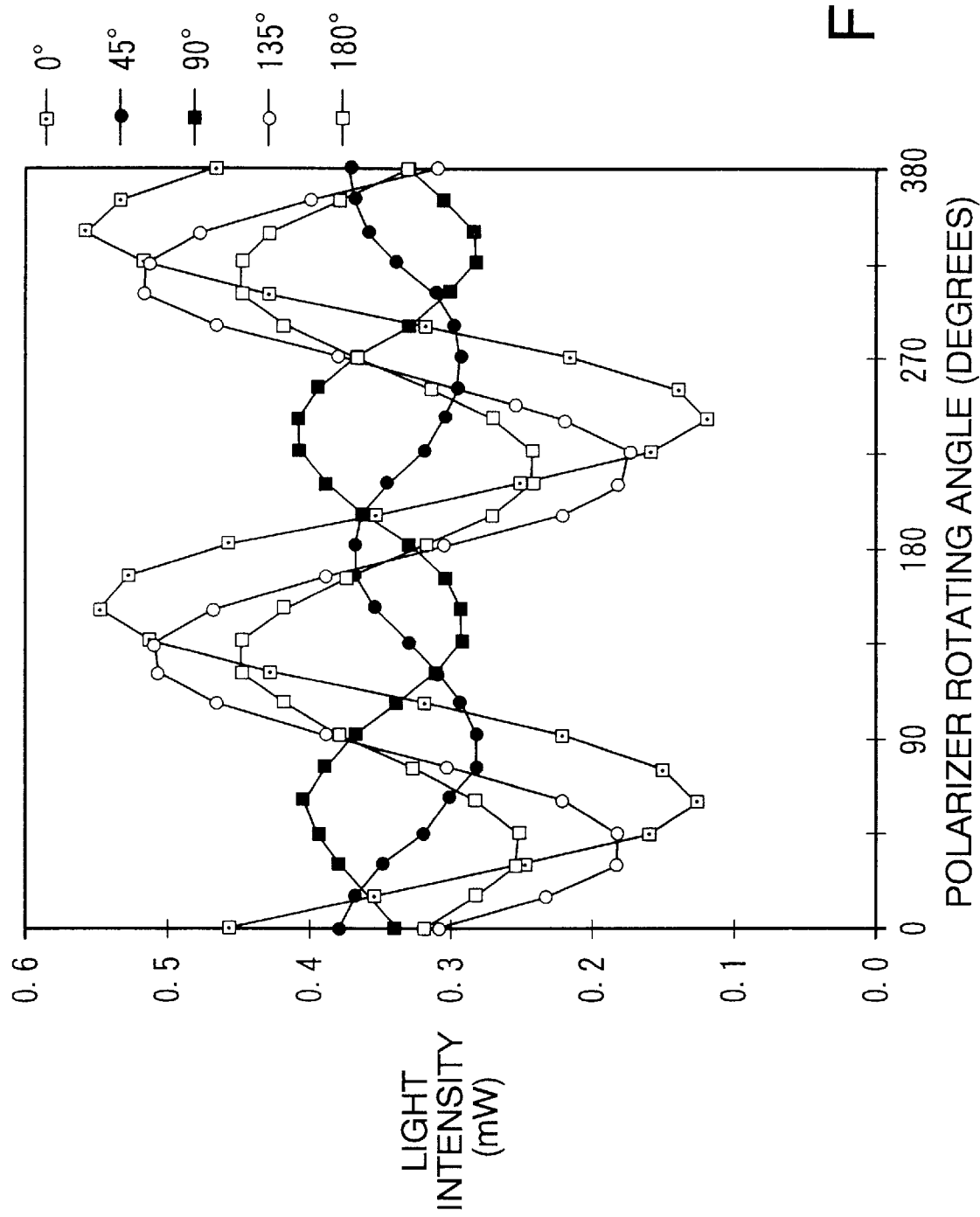
FIG. 26 is a graph showing measurements of the changes of polarization when the loop of optical fibers is turned.

FIG. 25 and FIG. 26 are graphs showing changes of the sensor 403 output where the orientation, twisting and bending state of the same optical fiber is varied, paying attention to one optical fiber. FIG. 25 shows measurement results in which the intermediate portion of the optical fiber 321 is bent in a U-shape, and with one, two and three loops (the one loop condition being shown in FIG. 23). FIG. 26 shows measurement results in which the optical fiber 321 is looped once (as shown in FIG. 23), and the loop rotated. through angles (0°, 45°, 90°, 135°, 180°) centering around an axis passing through the straight portions at the incident and exit sides.

As shown in FIGS. 25 and 26, both the amplitude and phase of the respective outputs are greatly changed by the changes in orientation, twisting and bending state. That is, the polarization states of the outgoing light are changed by the attaching states, orientation and bending state of optical fibers. Accordingly, it can be seen that practical construction of an actual device will often create changes in orientation, twisting and bending state leading to changes the polarization states.

Almost all the optical elements which constitute a scanning optical system have a polarization dependency in transmissivity and/or reflection. Especially, a beam splitter has a significant polarization dependency. For example, when 7.5% of the total light quantity is utilized as a monitor light flux, the transmissivity of the beam splitter in 10% for the P polarized light and 5% for the S polarized light with representative coating characteristics.

Therefore, for example, in a structure substantially similar to the third embodiment but having conventional APC optical and control elements, in a case where a light flux emitted from the first semiconductor laser 101 and exiting the optical fiber 321 is made incident to the light splitting surface of the beam splitter 144 as P polarized light, and a light flux emitted from the second semiconductor laser 102 and exiting from the optical fiber 322 is made incident to the light splitting surface of the beam splitter 144 as S polarized light, the ratio of the light quantity of the light flux transmitted through the beam splitter 144 is 2:1 (first:second), even though the light quantities of the first and second semiconductor lasers 101 and 102 are identical to each other. If the light emitting quantity of the semiconductor lasers were feed-back controlled by a conventional APC method (i.e., on the basis of the light quantity of a simple, uncompensated monitor light flux), the light emitting quantity of the first semiconductor laser 101 would be half the light emitting quantity of the second semiconductor laser 102.

In this example of a conventional APC operation, ignoring the polarization dependency of the optical elements on the way to the photoconductive drum 210, a difference in the light quantities of 100% (maximum) would be produced at the beam spots on the photoconductive drum 210. Even though the conventional APC is intended to control the light quantities of the beam spots on the photoconductive drum 210 to be equal, the light quantity difference is in fact increased by the use of the conventional APC. Since the difference in the light quantity of beam spots appears as a difference in the density of the printed pattern, a predetermined density balance is not obtained with the conventional APC. If there is a difference in the light intensity among a plurality of beams, for example, the pattern density becomes uneven at the portion where uniform pattern density is required.

It is possible to avoid such a shortcoming by eliminating the polarization dependency of the beam splitter 144. However, to produce a beam splitter having a great difference between the reflection and transmissivity ratios, as is required for optimum use of a small monitor flux to control a larger main flux, it is very difficult to produce a splitting surface having a small polarization dependency using current thin film technology. If the difference between the reflection ratio and transmissivity is made small, it is possible to produce a beam splitter having a small polarization dependency. However, in this case, the efficiency of utilization of the main light flux for image forming is decreased, and sufficient light intensity is not obtained with a small light source output. Accordingly, if a light source having a large output (to obtain sufficient light intensity) is used, the production cost is unacceptably increased.

Advantageously, in the device according to the third embodiment, a light (monitor) flux, having been transmitted through the beam splitter 144, is split into two polarization constituents orthogonal to each other. The respective polarization constituents are received by the first light receiving element 155 and second light receiving element 157. An APC signal S is obtained by weighting the output signals Ss and Sp of the respective light receiving elements 155 and 157 using the expression (3), i.e., S=K(Sp+k·Ss). Accordingly, the above-mentioned problem is solved by feed-back control of the outputs of each semiconductor laser 101 through 108 on the basis of the signal S.

Figure 27:
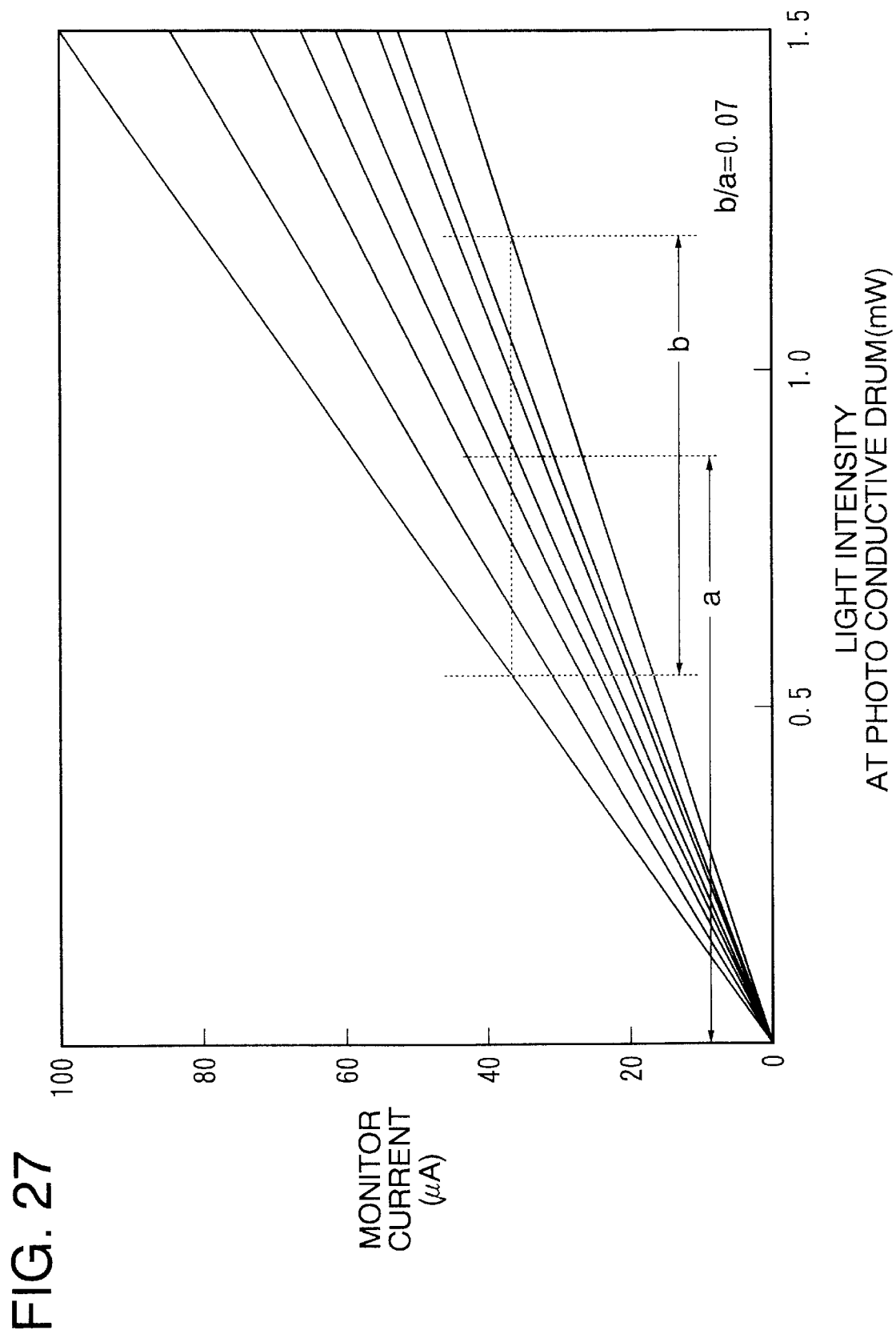
FIG. 27 is a graph showing measurements of unevenness of the light intensities on the photoconductive drum when a conventional APC is used.
Figure 28:
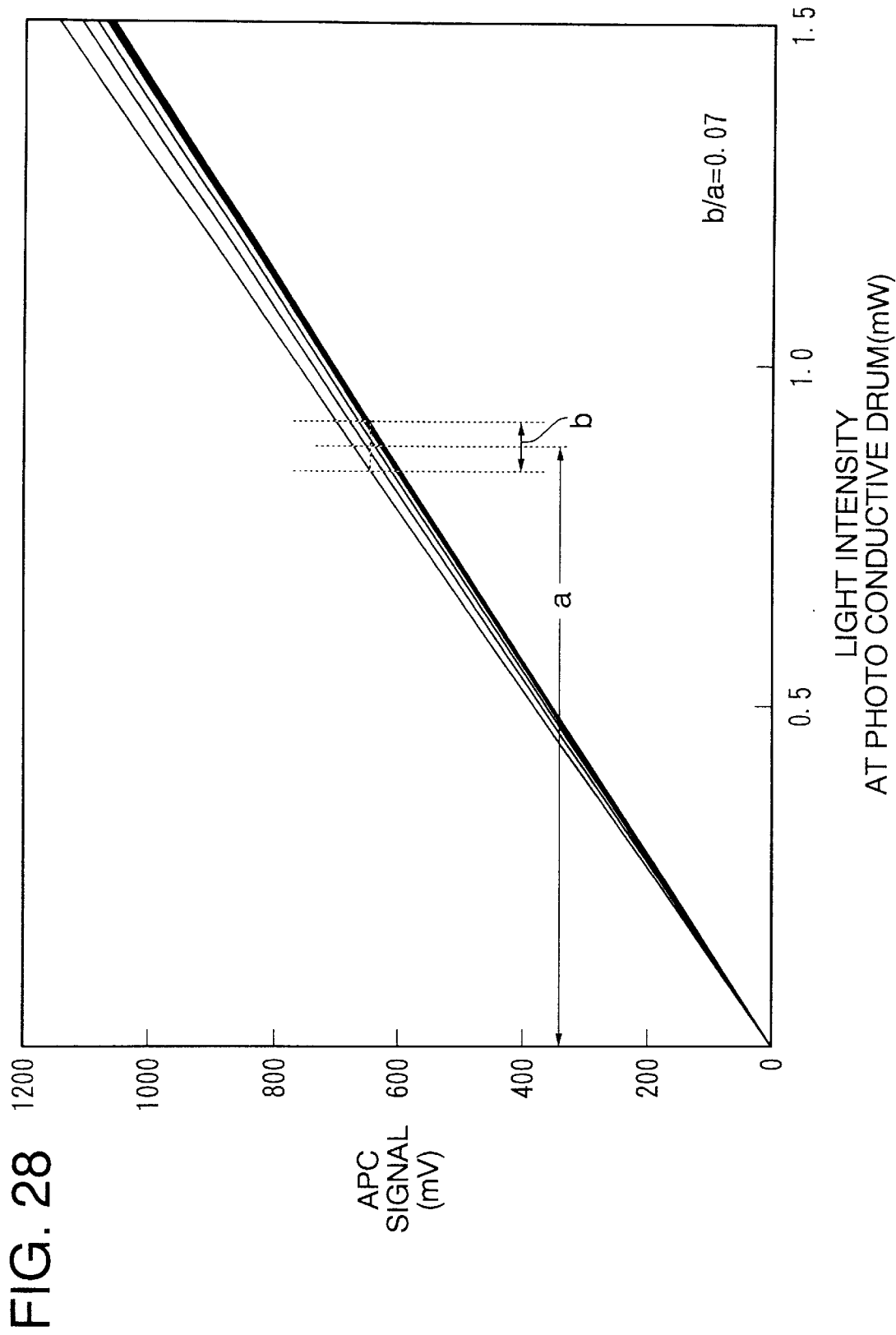
FIG. 28 is a graph showing measurements of unevenness of the light intensities on the photoconductive drum using APC according to the third embodiment invention.

In a set of examples summarized in Tables 1 through 3, and a set of experiments summarized in FIGS. 27 and 28, the light intensity on the photoconductive drum 210 controlled using the APC signal S calculated from expression (3) is compared with that controlled by directly utilizing the intensity of the monitor light flux.

In the examples, it is assumed that the transmissivity of S polarized light of the beam splitter 144 is 5%, and the transmissivity of P polarized light thereof is 10%. It is further assumed that the polarization characteristics of optical elements at the photoconductive drum 210 side (i.e., the cylindrical lens 170, polygonal mirror 480, fθ lens 190, and fold-over mirror 200) are synthesized in the beam splitter 144, and it is assumed that the loss due to these optical elements is 10% for P polarized light and 1% for S polarized light. Accordingly, a ratio Dp representing the P polarized light reflected by the beam splitter 144 of the light quantity which reaches the photoconductive drum 210 is 90%, and a ratio Ds representing the S polarized light reflected by the beam splitter 144 of the light quantity which reaches the photoconductive drum 210 is 99%. In this case, the values of the abovementioned coefficients k, k1 and k2 in expression (4) are:

$k1 = Mp/Ms = Hp/Hs = 2$;

$k2 = Ps/Pp = \{(1-Hs) \cdot Ds\}/\{(1-Hp) \cdot Dp\} = 1.16$; and $k = k1 \cdot k2 = 2.32$.

Table 1 below shows an example of conventional APC in which the intensity of the monitor light flux detected by a single light receiving element is directly utilized as an APC control quantity, and Table 2 shows an example in which the intensities Sp, Ss of each of the polarization constituents of the monitor light fluxes detected by the two light receiving elements 155 and 157 of the third embodiment are substituted in the abovementioned expression (3), S=K(Sp+k·Ss), to obtain the APC control quantity. In Tables 1 and 2, the intensity of S polarized light used as a reference for the APC control is carried out so that the intensities of the P polarized light and circular polarization are made coincident with the intensity of S polarized light. As incident light, P polarized light and S polarized light (which have the largest difference in transmissivity) are shown. Further, circularly polarized light, having intermediate characteristics between P and S polarized light, is shown. The respective intensities are shown in terms as a ratio with respect to the total light quantity incident to the beam splitter 144 (i.e., 1.000 being all of the light quantity incident into the beam splitter 144).

TABLE 1

| POLARI-ZATION | MONITOR FLUX INTENSITY | APC CONTROL AMOUNT | INTENSITY ON DRUM | |
|---|---|---|---|---|
| | | | APC OFF | APC ON |
| P | 0.100 | 0.100 | 0.810 | 0.405 |
| S | 0.050 | 0.050 | 0.941 | 0.941 |
| CIRCULAR | 0.075 | 0.075 | 0.874 | 0.583 |

TABLE 2

| POLARI-ZATION | MONITOR FLUX INTENSITY | | APC CONTROL | INTENSITY ON DRUM | |
|---|---|---|---|---|---|
| | Sp | Ss | AMOUNT | APC OFF | APC ON |
| P | 0.100 | 0.000 | 0.100 | 0.810 | 0.940 |
| S | 0.000 | 0.050 | 0.058 | 0.941 | 0.941 |
| CIRCULAR | 0.050 | 0.025 | 0.064 | 0.874 | 0.939 |

In the conventional example shown in Table 1, using conventional APC where P polarized light and S polarized light enter a beam splitter, a maximum intensity difference of about 2.3 times (0.941/0.405) is produced on the surface of a photoconductive drum 210. Therefore, it is not possible to control the density of latent image formed on the photoconductive drum in practice.

However, in the third embodiment shown in Table 2, since the intensity on the photoconductive drum when the APC is actuated is established at a consistent level regardless of changes of the polarization states, it is therefore possible to accurately control the density of the latent image formed on the photoconductive drum.

FIG. 27 is a graph showing the measurement results of experiments measuring the imbalance of light intensities on a photoconductive drum when the conventional APC is used as in the conventional example shown in Table 1, and FIG. 28 is a graph showing the measurement results of the same experiments when the third embodiment, as shown in Table 2, is used. FIGS. 27 and 28 show the relationship between the light intensity (abscissa, unit: mW) on a photoconductive drum and output (ordinate, unit: μA) of the current of a monitor light flux receiving sensor.

In FIG. 27, the light intensity (b/a) on an image plane using conventional APC changes by ±33.5% for the same monitor flux signal. However, in the third embodiment, as shown in FIG. 28 the change in light intensity is suppressed to ±3.5%. It can be seen that a remarkable improvement is brought in controlling the light intensity to be uniform on the surface of a photoconductive drum.

In an alternative construction, instead of taking into consideration both the polarization characteristics of the beam splitter 144 and those of the optical elements on the photoconductive drum 210 side, only the transmissivity of a beam splitter 144 (having the most significant polarization dependency) is taken into consideration. In this case, the APC control signal S is obtained by an expression, similar to expression (3): S=K(Sp+k1·Ss) is used. The symbols in the expression are identical to those in the abovementioned expression, where k1 is (Mp/Ms), the light intensity of the monitor light flux when P polarized light is incident to the beam splitter 144 is Mp and the light intensity of the monitor light flux when S polarized light is incident to the beam splitter 144 is Ms.

In a case where 5% to 10% of the total light quantity is split off as a monitor light flux, the intensity ratio of the monitor light flux will be about two times, according to the direction of polarization, for example, S polarized light (5%) and P polarized light (10%). On the other hand, the intensity ratio of the main flux after the monitor light is split will be about 1.06 times, e.g., S polarized light (95%) and P polarized light (90%) in the above example. The ratio of the intensity change of the main flux depending upon the polarization is only slight when compared with the monitor light (the monitor light flux being only a small portion of the main flux). Therefore, it is possible to correct the intensity of the monitor flux for only the polarization dependency of the transmissivity of the beam splitter 144.

Table 3 below shows data, similar to those in Table 2, where the APC according to the third embodiment is applied with only the polarization dependency of the beam splitter 144 taken into consideration. In this example, the ratios of each polarization constituent are shown as identical with or without APC control, based on the assumption that the total light quantity of light flux incident to the beam splitter 144 is fixed. If the total light quantity changes, the intensity after the change is kept fixed as when no APC is provided. However, if the APC is actuated, the intensities coincide with each other until the following level.

TABLE 3

| POLARI-ZATION | MONITOR FLUX INTENSITY | | APC CONTROL | INTENSITY ON DRUM | |
| --- | --- | --- | --- | --- | --- |
| | Sp | Ss | AMOUNT | APC OFF | APC ON |
| P | 0.100 | 0.000 | 0.500 | 0.810 | 0.810 |
| S | 0.000 | 0.050 | 0.058 | 0.941 | 0.941 |
| CIRCULAR | 0.050 | 0.025 | 0.054 | 0.874 | 0.874 |

In this alternative construction, in a case where the output of the semiconductor lasers 101 through 108 is controlled with only the polarization dependency of the beam splitter 144 taken into consideration, the intensity difference on a photoconductive drum 210 is about 1.16 times, and a significant improvement can be seen in performance in comparison with the conventional example shown in Table 1.

In the first and second embodiments, although the output power of the laser light source 100 (including semiconductor lasers 101 through 108) is controlled based on a monitor flux transmitted through the beam splitter 144, an alternative arrangement is possible in which the monitor flux is a reflected portion. Another alternative arrangement splits the monitor flux from the optical path between cylindrical lens 170 and polygonal mirror 180. In either case, the APC sensor system 150 detects the power of the monitor flux, and the remaining main flux is guided to polygonal mirror 180.

As described above, in the first and second embodiments, the power of the laser flux output from a laser light source is controlled so that the power of the main flux at the photoconductive drum 210 will always be maintained at a constant level, and the printing accuracy is thereby improved.

As described above, according to the third embodiment of the invention, since the APC signals are generated with the polarization dependency of at least the monitor-main flux beam splitter taken into consideration, the light quantity of the main light flux is accurately controlled regardless of the polarization states of light fluxes incident to the optical splitting element (the monitor-main flux beam splitter).

Furthermore, if the APC signals are generated taking into consideration the polarization dependency of optical elements coming after the optical splitting element, the light quantity of the main light flux is controlled at an even higher accuracy.

Therefore, even though the polarization states of light fluxes incident into the optical splitting elements may changed due to orientation, bending, aging, or environmental changes thereof, if the device and method according to the third embodiment of the invention are employed in a multi-beam scanning optical system (for example, using optical fibers), the intensity of beam spots on the scanning plane is controlled consistently on the basis of the monitor light flux regardless of the changes in polarization states.

The present disclosure relates to subject matter contained in Japanese Patent Application Nos. HEI 07-155180, filed on May 30, 1995, and HEI 08-075182, filed on Mar. 5, 1996, which are expressly incorporated herein by reference in their entireties.

What is claimed is:

1. A light intensity controlling device for controlling at least one light source, comprising:

a light splitting element for splitting a light flux emitted from the at least one light source into a monitor light flux and main light flux;

light detecting means for detecting a monitor light flux intensity;

an optical system for introducing said main light flux from said light splitting element onto an image plane;

correcting means for correcting an output of said light detecting means by adjusting said detected monitor light flux intensity, according to intensities of polarization components of said light flux as transformed by a polarization characteristic of at least said light splitting element, to obtain a constant correlation between said monitor light flux intensity and an intensity of said main light flux introduced onto an image plane by said optical system, irrespective of polarization states of said light flux entering said light splitting element; and controlling means for controlling a light emitting intensity of said at least one light source in response to said light detecting means as corrected by said correcting means.

2. The light intensity controlling device according to claim 1, wherein said at least one light source includes a semiconductor laser.

3. The light intensity controlling device according to claim 1,
  wherein said at least one said light source is provided with a transmission optical system comprising:
    an optical fiber for transmitting light emitted by said at least one light source to said light splitting element.

4. The light intensity controlling device according to claim 3,
  wherein the at least one light source includes a semiconductor laser.

5. The light intensity controlling device according to claim 1,
  wherein said correcting means corrects a polarization-dependent deviation in a relationship between said monitor light flux intensity and said main light flux intensity on the image plane, said polarization-dependent deviation resulting from the polarization characteristics of at least one of said light splitting element and said optical system.

6. The light intensity controlling device according to claim 1,
  wherein the at least one light source includes a plurality of light sources, each of said plurality of light sources independently controlled to emit light, and
  wherein said light detecting means detects said monitor light flux intensity of each of said plurality of light sources, and
  wherein said controlling means separately controls the output of each of said plurality of light sources, based on said monitor light flux intensity of each of said plurality light sources, in response to said light detecting means.

7. The light intensity controlling device according to claim 6,
  wherein said plurality of light sources are provided with a transmission optical system comprising:
    a plurality of optical fibers, each of said plurality of optical fibers corresponding to one of said plurality of light sources, said plurality of optical fibers transmitting light emitted by each of said plurality of light sources to the light splitting element.

8. The light intensity controlling device according to claim 7,
  wherein each of said plurality of light sources includes a semiconductor laser.

9. The light intensity controlling device according to claim 1,
  wherein said light detecting means comprises:
    a polarization splitting element for splitting said monitor light flux into first linearly polarized light and second linearly polarized light having electric field vector vibration directions orthogonal to each other;
    a first light receiving element for receiving said first linearly polarized light, and
    a second light receiving element for receiving said second linearly polarized light.

10. The light intensity controlling device according to claim 9,
  wherein said correcting means is connected to said first light receiving element and said second light receiving element, and
  wherein said correcting means applies a weighting to an output of said first light receiving element and to an output of said second light receiving element, said weighting giving a predetermined weight to said output of said first light receiving element and output of said second light receiving element based on a predetermined relationship, a light intensity at said image plane, between said first linearly polarized light and said second linearly polarized light.

11. The light intensity controlling device according to claim 10,
  wherein the at least one light source includes a semiconductor laser.

12. The light intensity controlling device according to claim 10,
  wherein said correcting means is provided with a gain setting means which electrically applies said weighting to said output of said first light receiving element and said output of said second light receiving element.

13. The light intensity controlling device according to claim 10,
  wherein said correcting means applies said weighting by generating an output signal S to said controlling means according to an expression:

$$S = K(Sp + k \cdot Ss);$$

wherein K is a constant, $k = (Mp/Ms) \cdot (Ps/Pp)$, and
  wherein when said first linearly polarized light enters said light splitting element, said monitor light flux intensity is Mp and said main light flux intensity on the image plane is Pp, and
  wherein when said second linearly polarized light enters said light splitting element, said monitor light flux intensity is Ms and said main light flux intensity on the image plane is Ps, and
  wherein said output of said first light receiving element is Sp and said output of the second light receiving element is Ss.

14. The light intensity controlling device according to claim 10,
  wherein said correcting means comprises a flux reduction means for controlling the light quantity of at least one of said first linearly polarized light and said second linearly polarized light.

15. The light intensity controlling device according to claim 14,
  wherein said flux reduction means includes a neutral density filter.

16. The light intensity controlling device according to claim 14,
  wherein said flux reduction means includes a polarizer.

17. The light intensity controlling device according to claim 1,
  wherein said light detecting means includes a single light receiving element, and
  wherein said correcting means includes a polarizer between the light splitting element and the light receiving element.

18. The light intensity controlling device according to claim 17,
  wherein said polarizer includes:
    means for setting said polarizer so that a correlation between a quantity of light entering the light splitting element and a quantity of light exiting the polarizer, in a first case wherein first linearly polarized light enters the light splitting element, is identical to said correlation in a second case wherein second linearly polarized light, having an electric field vector vibration direction orthogonal to that of the first linearly polarized light, enters the light splitting element.

19. A light intensity controlling device for controlling a plurality of independently controllable light sources, comprising:

a light splitting element for splitting a plurality of light fluxes emitted from the plurality of light sources into a plurality of monitor light fluxes and a plurality of main light fluxes;

an optical system for introducing said plurality of main light fluxes from said light splitting element onto an image plane;

light detecting means for detecting a plurality of monitor light flux intensities corresponding to said plurality of monitor light fluxes and for outputting a plurality of signals corresponding to said plurality of monitor light flux intensities;

correcting means for correcting variations between said plurality of output signals, said variations being dependent on differing states of polarization of said plurality of incident light fluxes entering the light splitting means; and controlling means for controlling light emitting intensities of the plurality of light sources in response to said plurality of corrected output signals of said light detecting means as corrected by said correcting means.

20. The light intensity controlling device according to claim 19,
wherein the plurality of light sources each include a semiconductor laser.

21. The light intensity controlling device according to claim 19,
wherein said correcting means corrects an output of said light detecting means by adjusting said detected monitor light flux intensities, according to intensities of polarization components of said light fluxes as transformed by polarization characteristics of at least said light splitting element, to obtain a constant correlation between said monitor light flux intensities and intensities of said main light fluxes introduced onto an image plane by said optical system.

22. The light intensity controlling device according to claim 19,
wherein said correcting means is adjusted so that the output of said correcting means has a constant correlation with respect to the quantities of said main light fluxes on an image plane, regardless of states of polarization of said incident light fluxes entering said light splitting element.

23. The light intensity controlling device according to claim 19, wherein said light detecting means comprises:
a polarization splitting element for splitting said plurality of monitor light fluxes into first linearly polarized light an second linearly polarized light having electric field vector vibration directions orthogonal to each other;
a first light receiving element for receiving said first linearly polarized light; and
a second light receiving element for receiving said second linearly polarized light.

24. The light intensity controlling device according to claim 23,
wherein said correcting means is connected to said first light receiving element and said second light receiving element, and
wherein said correcting means applies a weighting to an output of said first light receiving element and to an output of said second light receiving element, said weighting giving a predetermined weight to said output of said first light receiving element and said output of said second light receiving element based on a relationship of a light intensity at said image plane, between said first linearly polarized light and said second linearly polarized light.

25. The light intensity controlling device according to claim 24,
wherein the plurality of light sources each include a semiconductor laser.

26. The light intensity controlling device according to claim 24,
wherein said correcting means is provided with a gain setting means which electrically applies said weighting to said output of said first light receiving element and said output of said second light receiving element.

27. The light intensity controlling device according to claim 24,
wherein said correcting means applies said weighting by generating an output signal S to said controlling means according to an expression:

$$S = K(Sp + k \cdot Ss);$$

wherein K is a constant, $k = (Mp/Ms) \cdot (Ps/Pp)$, and
wherein when said first linearly polarized light enters said light splitting element, a representative one of said plurality of said monitor light flux intensities is Mp and a representative one of said main light flux intensities on the image plane and is Pp,
wherein when said second linearly polarized light enters said light splitting element, a representative one of said monitor light flux intensities is Ms and a representative one of said main light flux intensities on the image plane is Ps, and
wherein said output of said first light receiving element is Sp and said output of the second light receiving element is Ss.

28. The light intensity controlling device according to claim 24,
wherein said correcting means comprises a flux reduction means for controlling the light quantity of at least one of said first linearly polarized light and said second linearly polarized light.

29. The light intensity controlling device according to claim 19,
wherein said light detecting means includes a single light receiving element, and
wherein said correcting means includes a polarizer between the light splitting element and the light receiving element.

30. A light intensity controlling device for a scanning optical system, said scanning optical system having a plurality of semiconductor lasers generating a plurality of light fluxes, a deflector that deflects the plurality of light fluxes, and a scanning lens for converging the polarized light fluxes to form a plurality of beam spots on a scanning target plane, the light intensity controlling device comprising:

a light splitting element between the semiconductor lasers and deflector for splitting the plurality of light fluxes into a plurality of corresponding monitor light fluxes and a plurality of corresponding main light fluxes;

light detecting means for detecting the intensity of the plurality of monitor light fluxes;

correcting means for correcting an output of said light detecting means by adjusting said detected monitor light flux intensities, according to intensities of polarization components of said light fluxes as changed by polarization characteristics of at least said light splitting element, to obtain a constant correlation between said monitor light flux intensities and intensities of said main light fluxes introduced onto said scanning target plane by said optical system irrespective of polarization states of said light fluxes entering said light splitting element; and controlling means for controlling a light, emitting intensity of the plurality of semiconductor lasers in response to said light detecting means as corrected by said correcting mean.

31. The light intensity controlling device according to claim 30, further comprising:

a plurality of optical fibers corresponding to each of said plurality of semiconductor lasers, and wherein said plurality of optical fibers leads said plurality of light fluxes from each of the plurality of semiconductor lasers to said light splitting element, and said the light splitting element splits said plurality of light fluxes exiting said optical fibers.

32. The light intensity controlling device according to claim 30, wherein said light detecting means comprises:

a polarization splitting element for splitting said plurality of monitor light fluxes into first linearly polarized light and second linearly polarized light having electric field vector vibration directions orthogonal to each other;

a first light receiving element for receiving said first linearly polarized light;

a second light receiving element for receiving said second linearly polarized light; and weighting means that applies weightings to an output of said first light receiving element and to an output of said second light receiving element.

33. The light intensity controlling device according to claim 32, wherein said correcting means comprises:

a polarizer located between said polarization splitting element and said first light receiving element, said polarizer being arranged at an angle θ formed between an electric field vibration direction of a first linearly polarized light and a transmission axis of the polarizer in a plane perpendicular to the incident direction of said plurality of light fluxes and is defined by an expression:

$$\theta = \tan^{-1}\sqrt{k} \ ;$$

wherein k=(Mp/Ms)·(Ps/Pp), and wherein when the first linearly polarized light enters the light splitting element, the intensity of a monitor light flux is Mp and the intensity of said main light flux on the image plane is Pp, and wherein when a second linearly polarized light enters the light splitting element, the intensity of said monitor light flux when is Ms, and the intensity of said main light flux on the image plane is Ps.

34. A light intensity controlling device for a multi-beam optical device, comprising:

a plurality of light sources for emitting a plurality of light fluxes;

controlling means for independently controlling the light emission of said light sources;

an optical system for introducing said plurality of light fluxes onto an image plane; and means for correcting variations between intensities among said plurality of light fluxes on the image plane, said variations dependent on the polarization characteristics of at least one optical element of said optical system.

35. A light intensity controlling device for a scanning optical system, comprising:

a plurality of light sources for emitting a plurality of light fluxes;

a deflector that deflects said plurality of light fluxes;

controlling means for independently controlling the light emission of said light sources;

an optical system, including a scanning lens for converging said plurality of light fluxes onto an image plane; and means for correcting variations between intensities among said plurality of light fluxes on the image plane, said variations dependent on the polarization characteristics of at least one optical element of said optical system.

36. A light intensity controlling device for controlling a light flux, emitted by a laser and passing through an optical system, according to a monitor flux split from the light flux, said light intensity controlling device comprising:

a polarization beam splitter applied to the monitor flux, said polarization beam splitter splitting the monitor flux into a first linearly polarized flux having a first electric field vector vibration direction and a second linearly polarized flux having a second electric field vector vibration direction, said first electric field vector vibration direction and said second electric field vector vibration direction being orthogonal to each other;

a first intensity sensor applied to said first linearly polarized flux and generating first intensity signals;

a second intensity sensor applied to said second linearly polarized flux and generating second intensity signals;

an automatic power control system, including:

a compensation gain adjustment circuit, applied to said second intensity signals, said compensation adjustment circuit compensating said second intensity signals with respect to said first intensity signals based on a difference between an intensity in said second electric field vector vibration direction and an intensity in said first electric field vector vibration direction of said light flux after passing through the optical system;

adder for adding said first intensity signals and said compensated second intensity signals to produce compensated feedback signals; and a laser control circuit connected to said automatic power control system and the laser, said laser control circuit controlling the emitting intensity of the laser at a predetermined level according to the compensated feedback signals.

37. The light intensity controlling device according to claim 36, wherein the laser includes a plurality of lasers sequentially emitting a plurality of light fluxes, and wherein said automatic power control system includes:

a timing circuit that sequences said automatic power control system to individually control the emitting intensity of each of said plurality of lasers according to said first intensity signals and said second intensity signals.

38. A scanning optical device, comprising:

at least one semiconductor laser for generating a laser flux;

an optical fiber for guiding said laser flux from said semiconductor laser, said optical fiber having a first polarization dependency that alters said laser flux;

a beam splitter that splits the laser flux from said optical fiber into a monitor flux and a main flux having second polarization dependency that alters said monitor flux an said main flux;

a scanning optical system that focuses and scans said main flux from said beam splitter;

a photoconductive member that receives the scanned and focused main flux from the scanning optical system;

a polarization-compensating light receiving system that receives said monitor flux from said beam splitter and generates polarization-compensated intensity signals based on said alteration in said laser flux at said optical fiber and said alteration in said monitor flux and said main flux at said beam splitter; and an automatic power control system that receives said polarization-compensated intensity signals and controls the intensity of said laser flux according to the polarization-compensated intensity signals.

39. The scanning optical device according to claim 38, wherein said scanning optical system has a third polarization dependency that alters said main flux, and said polarization-compensating light receiving system generates said polarization-compensated intensity signals based on said alteration in said laser flux at said optical fiber, said alteration in said monitor flux and said main flux at said beam splitter, and said alteration in said main flux at said scanning optical system.

40. The scanning optical device according to claim 38, wherein said at least one semiconductor laser includes a plurality of semiconductor lasers sequentially emitting a plurality of light fluxes, and wherein said automatic power control system includes:

a timing circuit that sequences said automatic power control system to individually control the intensity of each of said plurality of laser fluxes according to said polarization-compensated intensity signals.

41. A light intensity controlling method for controlling a source light flux according to a monitor light flux, wherein the monitor light flux and a main light flux are split by a beam splitter from the source light flux, the method comprising:

measuring the light intensity of the monitor light flux, and the light intensity of the main light flux introduced at an image plane by an optical system after the beam splitter, when a first linearly polarized light split is incident to the beam splitter;

measuring the light intensity of the monitor light flux, and the light intensity of the main light flux introduced at the image plane by the optical system after the beam splitter when a second linearly polarized light, having an electric field vector vibration direction orthogonal to that of the first linearly polarized light, is incident to the beam splitter; and adjusting a correction for light detection output, according to intensities of polarization components of the source light flux as changed by polarization characteristics of at least the beam splitter, to obtain a constant correlation between said light intensity of the monitor light flux and said light intensity of said main flux introduced at the image plane by the optical system after the beam splitter, and said method further comprising:

correcting light detection output according to the correction; and controlling the source light flux on the basis of the corrected light detection output.

42. A light intensity controlling method for controlling a plurality of independently controlled source light fluxes according to a plurality of monitor light fluxes, wherein the plurality of monitor light fluxes and a plurality of main light fluxes are split by a beam splitter from the plurality of source light fluxes, the method comprising:

measuring the light intensity of a representative monitor light flux, and the light intensity of a representative main light flux introduced at an image plane by an optical system after the beam splitter, when a first linearly polarized light is incident to the beam splitter;

measuring the light intensity of said representative monitor light flux, and the light intensity of said representative main light flux at the image plane by the optical system after the beam splitter, when a second linearly polarized light having an electric field vector vibration direction orthogonal to that of the first linearly polarized light, is incident to the beam splitter; and adjusting a correction for light detection output, according to intensities of polarization components of the source light fluxes as changed by polarization characteristics of at least the beam splitter, to obtain a constant correlation between said representative monitor light fluxes and said representative main fluxes introduced at the image plane by the optical system after the beam splitter, and said method further comprising:

correcting light detection output according to the correction; and controlling the plurality of source light fluxes on the basis of the corrected light detection output.

43. A light intensity controlling method for controlling a plurality of independently controlled source light fluxes according to a plurality of monitor light fluxes, wherein the plurality of monitor light fluxes and a plurality of main light fluxes are split by a beam splitter from the plurality of source light fluxes, the method comprising:

measuring the light intensity of a representative monitor light flux, and the light intensity of a representative main light flux introduced at an image plane by an optical system after the beam splitter, when a first linearly polarized light split isincident to the beam splitter;

measuring the light intensity of said representative monitor light flux, and the light intensity of said representative main light flux at the image plane by the optical system after the beam splitter, when a second linearly polarized light having an electric field vector vibration direction orthogonal to that of the first linearly polarized light, is incident to the beam splitter; and weighting a first light detection output and a second light detection output by giving a predetermined weight to said first light detection output and said second light detection output based on a relationship, in a light intensity at said image plane, between said first linearly polarized light and said second linearly polarized light, and said method further comprising:
splitting said plurality of monitor light fluxes into first linearly polarized light and second linearly polarized light having electric field vector vibration directions orthogonal to each other;
correcting said first light detection output and said second light detection output according to the weighting; and
controlling the plurality of source light fluxes on the basis of the said corrected first light detection output and said corrected second light detection output.

44. A light intensity controlling method for controlling a plurality of independently controllable source light fluxes according to a plurality of monitor light fluxes, wherein the plurality of monitor light fluxes and a plurality of main light fluxes are split by a beam splitter from the plurality of source light fluxes, the method comprising:
sequentially emitting a plurality of source light fluxes;
splitting said plurality of monitor light fluxes into first polarization constituents and second polarization constituents having polarization directions orthogonal to each other;
detecting said first polarization constituents;
detecting said second polarization constituents;
weighting said first polarization constituents and said second polarization constituents;
adding said weighted first polarization constituents and said weighted second polarization constituents; and
controlling intensity of said plurality of independently controllable source light fluxes on the basis of the result of the addition.

45. The light intensity controlling method according to claim 44,
wherein said first polarization constituent and said second polarization constituent are weighted so that the result of the addition has a constant correlation between the light intensity of the monitor light fluxes and the light intensity of the main light fluxes on the scanning image plane, regardless of the state of polarization of the light fluxes incident to the beam splitter.

46. A light intensity controlling method for controlling a source light flux according to a monitor light flux, wherein the monitor light flux and a main light flux are split by a beam splitter from the source light flux, the method comprising:
calculating, according to design values, the light intensity of the monitor light flux, and the light intensity of the main light flux introduced at an image plane by an optical system after the beam splitter, for a first linearly polarized light split by the beam splitter;
calculating, according to design values, the light intensity of the monitor light flux, and the light intensity of the main light flux introduced at the image plane by the optical system after the beam splitter for a second linearly polarized light, having an electric field vector vibration direction orthogonal to that of the first linearly polarized light, split by the beam splitter; and
adjusting a correction for light detection output, according to intensities of polarization components of the source light flux as changed by polarization characteristics of at least the beam splitter, to obtain a constant correlation between said calculated monitor light flux intensities and said calculated main flux intensities introduced at the image plane by the optical system after the beam splitter, and said method further comprising:
correcting light detection output according to the correction; and
controlling the source light flux on the basis of the corrected light detection output.

47. A light intensity controlling device for controlling at least one light source, comprising:
a light splitting element for splitting a light flux emitted from the at least one light source into a monitor light flux and main light flux;
light detecting means for detecting a monitor light flit intensity;
an optical systems for introducing said main light flux from said light splitting element onto an image plane;
correcting means for correcting an output of the light detecting means by applying a constant correlation between said monitor light flux intensity and an intensity of said main light flux introduced onto an image plane by said optical system, according to polarization states of said light flux entering said light splitting element; and
controlling means for controlling a light emitting intensity of the at least one light source in response to said light detecting means as corrected by said correcting means.

48. The light intensity controlling device according to claim 47,
wherein the at least one light source includes a semiconductor laser.

49. The light intensity controlling device according to claim 47,
wherein at least one said light source is provided with a transmission optical system comprising:
an optical fiber for transmitting light emitted by the at least one light source to said light splitting element.

50. The light intensity controlling device according to claim 49,
wherein the at least one light source includes a semiconductor laser.

51. The light intensity controlling device according to claim 47,
wherein said correcting means corrects a polarization-dependent deviation in a relationship between said monitor light flux intensity and said main light flux intensity on the image plane, said polarization-dependent deviation resulting from the polarization characteristics of at least one of the light splitting element and said optical system.

52. The light intensity controlling device according to claim 47,
wherein the at least one light source includes a plurality of light sources, each of said plurality of light sources independently controlled to emit light, and
wherein said light detecting means detects said monitor light flux intensity of each of said plurality of light sources, and
wherein said controlling means separately controls the output of each of said plurality of light sources, based on said monitor light flux intensity of each of said plurality light sources, in response to said light detecting means.

53. The light intensity controlling device according to claim 52,
wherein said plurality of light sources are provided with a transmission optical system comprising:
a plurality of optical fibers, each corresponding to one of said plurality of light sources, said plurality of optical fibers transmitting light emitted by each of said plurality of light sources to the light splitting element.

54. The light intensity controlling device according to claim 53, wherein each of said plurality of light sources includes a semiconductor laser.

55. The light intensity controlling device according to claim 47, wherein said light detecting means comprises:
a polarization splitting element for splitting said monitor light flux into first linearly polarized light and second linearly polarized light having electric field vector vibration directions orthogonal to each other;
a first light receiving element for receiving said first linearly polarized light; and
a second light receiving element for receiving said second linearly polarized light.

56. The light intensity controlling device according to claim 55, wherein said correcting means comprises a flux reduction means for controlling the light quantity of at least one of said first linearly polarized light and said second linearly polarized light.

57. The light intensity controlling device according to claim 56, wherein said flux reduction means includes a neutral density filter.

58. The light intensity controlling device according to claim 56, wherein said flux reduction means includes a polarizer.

59. The light intensity controlling device according to claim 47, wherein said light detecting means includes a single light receiving element, and
wherein said correcting means includes a polarizer provided between the light splitting element and the light receiving element.

60. The light intensity controlling device according to claim 59, wherein said polarizer includes:
means for setting said polarizer so that the quantity of light entering the light splitting element and the quantity of light exiting the polarizer are equal for first linearly polarized light entering the light splitting element; and for second linearly polarized light, having an electric field vector vibration direction orthogonal to that of the first linearly polarized light, entering the light splitting element.

* * * * *

UNITED STATES PATENT AND TRADEMARK OFFICE
CERTIFICATE OF CORRECTION

PATENT NO. : 5,892,219
DATED : April 6, 1999
INVENTOR(S) : MINAKUCHI et al.

It is certified that error appears in the above-identified patent and that said Letters Patent is hereby corrected as shown below:

On the cover, insert —Section [30], Foreign Application Priority Data, May 30, 1995 [JP] Japan HEI7-155180; Mar 5, 1996 [JP] Japan HEI8-75182—.

In column 28, line 3 (claim 10, line 12), change ", a" to —of a—.

In column 36, line 11 (claim 47, line 6) change "flit" to —flux—.

Signed and Sealed this

Twenty-fourth Day of August, 1999

Attest:

Q. TODD DICKINSON

*Attesting Officer*    Acting Commissioner of Patents and Trademarks